United States Patent
Garmire et al.

(10) Patent No.: US 10,750,618 B2
(45) Date of Patent: Aug. 18, 2020

(54) SYSTEM AND METHOD FOR MANUFACTURE OF CIRCUIT BOARDS

(71) Applicant: University of Hawaii, Honolulu, HI (US)

(72) Inventors: David Garmire, Ann Arbor, MI (US); Jie Zhou, Honolulu, HI (US); Tamra Oyama, Honolulu, HI (US)

(73) Assignee: University of Hawaii, Honolulu, HI (US)

(*) Notice: Subject to any disclaimer, the term of this patent is extended or adjusted under 35 U.S.C. 154(b) by 0 days.

(21) Appl. No.: 16/386,191

(22) Filed: Apr. 16, 2019

(65) Prior Publication Data

US 2019/0327837 A1 Oct. 24, 2019

Related U.S. Application Data

(60) Provisional application No. 62/659,252, filed on Apr. 18, 2018.

(51) Int. Cl.
*H05K 3/18* (2006.01)
*H05K 3/38* (2006.01)

(52) U.S. Cl.
CPC ............. *H05K 3/184* (2013.01); *H05K 3/381* (2013.01); *H05K 3/387* (2013.01)

(58) Field of Classification Search
None
See application file for complete search history.

(56) References Cited

U.S. PATENT DOCUMENTS

| | | | |
|---|---|---|---|
| 2004/0145629 A1* | 7/2004 | Silverbrook | B22F 3/008 347/40 |
| 2005/0128720 A1* | 6/2005 | Croswell | H05K 1/162 361/763 |
| 2014/0231266 A1* | 8/2014 | Sherrer | B29C 64/106 205/136 |
| 2016/0358897 A1* | 12/2016 | Albers | H01L 25/50 |

* cited by examiner

*Primary Examiner* — Shamim Ahmed
(74) *Attorney, Agent, or Firm* — Snell & Wilmer L.L.P.

(57) ABSTRACT

Methods, systems, and apparatus for fabricating a circuit board. The method includes fabricating, using an additive manufacturing device, a trace layer, a sacrificial layer, a rail layer and a lid. The method includes placing the sacrificial layer on the trace layer such that the raised traces protrude through corresponding openings of the sacrificial layer. The method includes depositing a conductive material on top of the sacrificial layer and the plurality of traces. The method includes removing the sacrificial layer from the trace layer and placing the rail layer on the trace layer such that the raised traces align with the corresponding openings of the rail layer. The method includes connecting one or more electrical components and melting a sealing sheet on top of the rail layer and the electrical components to reinforce connections and to provide protection. The method includes placing the lid on top of the sealing sheet.

20 Claims, 23 Drawing Sheets

☐ Trace layer  ☒ Sacrificial layer  ☒ Rail layer  ☒ PCL sheet  ☐ Ga-Sn Alloy

☐ First trace layer ☒ Second trace layer ☐ Sacrificial layer ☒ Rail layer ☒ PCL sheet ☐ Ga-Sn Alloy First trace layer  Second trace layer  Sacrificial layer  Rail layer  PCL sheet  Ga-Sn Alloy

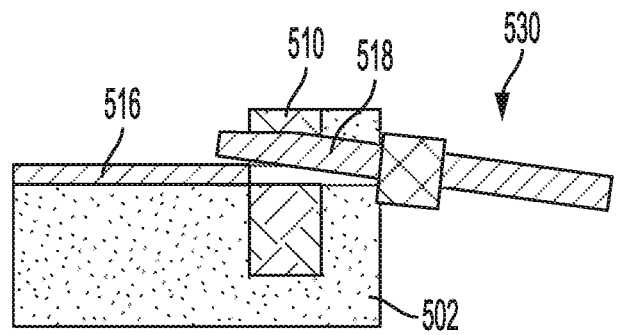
FIG. 5A
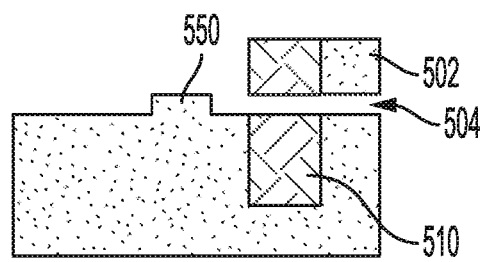
FIG. 5B
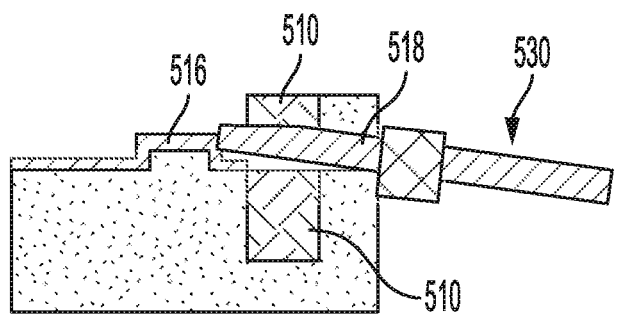
FIG. 5C
 Trace layer  Rail layer  Ga-Sn Alloy

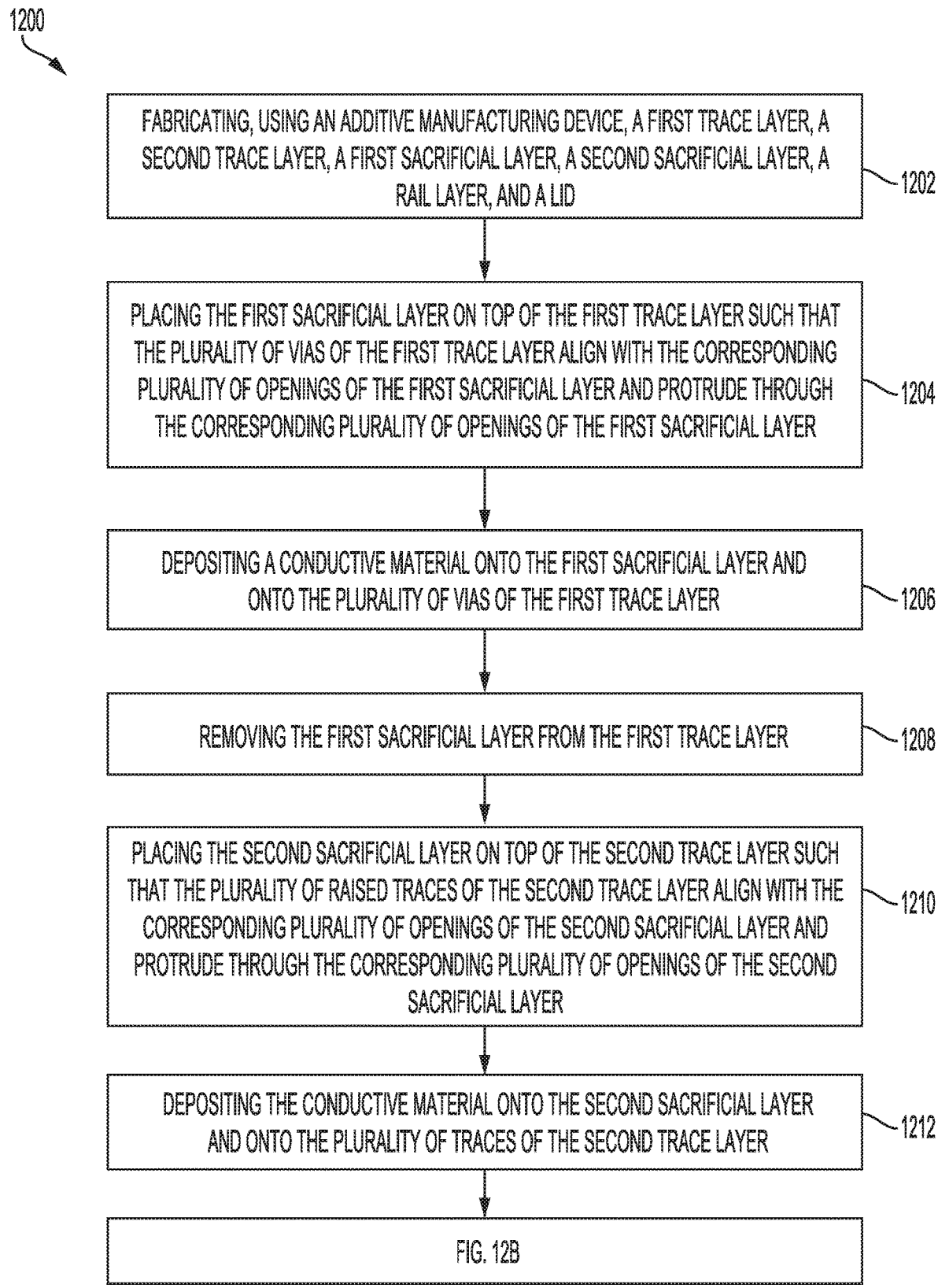

SYSTEM AND METHOD FOR MANUFACTURE OF CIRCUIT BOARDS

CROSS REFERENCE TO RELATED APPLICATIONS

This application claims the benefit and priority of U.S. Provisional Application Ser. No. 62/659,252, filed Apr. 18, 2018, entitled "ZOG (Zhou-Oyama-Garmire) Method," the contents of which are herein incorporated by reference in its entirety.

GOVERNMENT LICENSE RIGHTS

This invention was made with United States government support under Contract No. 1557349 awarded by the National Science Foundation. The United States government has certain rights in this invention.

BACKGROUND

1. Field

This specification relates to systems and methods for manufacturing circuit boards.

2. Description of the Related Art

The current state of the art for fabricating printed circuit boards (PCBs) includes the mechanical milling of copper circuit boards and the soldering of electronic components into place. The copper board consists of a copper sheet laminated onto an electrically insulating fiber resin or glass requiring powerful presses, rolling equipment, and potentially toxic substances such as epoxies. A milling machine employing a selection of drill bits isolates the wire traces by removing copper on the surface. Oftentimes, during this milling process, expensive drill bits are broken or worn down, or the traces do not have the proper width or other parameters. Alternatively, laser etching may be used; however, there is a high cost to obtain a laser cutter that is capable of cutting through the metal layers. Laser cutting creates concerns about eye safety and generated vapors. Wet and dry chemical etching also poses a safety threat. Working with hazardous chemicals such as ferric chloride, ferric nitrate, and hydrochloric acids can be detrimental to human health if handled incorrectly. Afterwards, final processing steps include placing solder-paste through a stencil with the pads cut out, placing components on the solder-pasted pads, and then using a reflow oven or another direct application of heat to melt the feet of the components onto the traces. Labeling and isolation is further achieved by adding additional polymer layers onto the surface.

For using the PCB in underwater sensing, the PCB is potted in an epoxy, resin, or thermo/photo-setting polymer. Adhesive problems lead to breakage of such seals over time resulting in water intrusion and destruction of the sensing circuitry. Furthermore, there are concerns about the toxicity that PCBs pose on the environment. The length and expense of the milling process makes iterating circuit designs a time-consuming process and unsatisfactory for rapid prototyping.

Fabricating multilayer circuits is a complex process involving many steps. First, the circuit design is transferred to the board, possibly using ultraviolet (UV) light polymerization. Next, the inner layers need to be etched using chemicals such as copper chloride and ferric chloride. The lamination process involves applying an oxide layer to each layer and then stacking the layers together at a certain temperature and pressure. Holes are then drilled and copper plated to form connections between the layers. This is followed by preparing the via holes using solder mask ink or epoxy resin and a stencil. Finally solder mask ink is applied to the board and exposed areas are cured with UV light. The covered parts have the ink removed in a chemical process. Finally, the board surface is finished with materials such as electroless nickel immersion gold and tested for performance. This method for fabricating multilayer PCBs requires expensive specialized equipment and toxic materials.

SUMMARY

What is described is a method for fabricating a circuit board. The method includes fabricating, using an additive manufacturing device, a trace layer, a sacrificial layer, a rail layer and a lid. The trace layer has a plurality of raised traces, the sacrificial layer has a plurality of openings corresponding to the plurality of raised traces of the trace layer, and the rail layer has a plurality of openings corresponding to the plurality of raised traces of the trace layer and one or more recesses for receiving electrical components. The method also includes placing the sacrificial layer on top of the trace layer such that the plurality of raised traces of the trace layer align with the corresponding plurality of openings of the sacrificial layer and protrude through the corresponding plurality of openings of the sacrificial layer. The method also includes depositing a conductive material on top of the sacrificial layer and the plurality of traces of the trace layer. The method also includes removing the sacrificial layer from the trace layer. The method also includes placing the rail layer on top of the trace layer such that the plurality of raised traces of the trace layer align with the corresponding plurality of openings of the rail layer. The method also includes connecting one or more electrical components to be in electrical communication with the conductive material by placing the electrical components in the respective one or more recesses of the rail layer. The method also includes melting a sealing sheet on top of the rail layer and the electrical components to reinforce connections between the electrical components and the conductive material and to provide elemental protection. The method also includes placing the lid on top of the sealing sheet while the sealing sheet is warm, the lid configured to reinforce connections between the electrical components and the conductive material and to provide elemental protection.

Also described is a method for fabricating a multilayer circuit board. The method includes fabricating, using an additive manufacturing device, a first trace layer, a second trace layer, a sacrificial layer, a rail layer, and a lid. The first trace layer has a plurality of vias, the second trace layer has a plurality of raised traces and a plurality of openings corresponding to the plurality of vias, the sacrificial layer has a plurality of openings corresponding to the plurality of raised traces of the second trace layer, and the rail layer has a plurality of openings corresponding to the plurality of raised traces of the second trace layer and one or more recesses for receiving electrical components. The method also includes depositing a conductive material onto at least a portion of the first trace layer, including the plurality of vias. The method also includes placing the sacrificial layer on top of the second trace layer such that the plurality of raised traces of the second trace layer align with the corresponding plurality of openings of the sacrificial layer and protrude through the corresponding plurality of openings of the sacrificial layer. The method also includes depositing the conductive material onto the sacrificial layer and the plurality of traces of the second trace layer. The method also includes removing the sacrificial layer from the second trace layer. The method also includes placing the second trace layer on top of the first trace layer such that the plurality of vias of the first trace layer align with and protrude from the corresponding plurality of openings of the second trace layer. The method also includes placing the rail layer on top of the second trace layer such that the plurality of raised traces of the second trace layer align with the corresponding plurality of openings of the rail layer. The method also includes connecting one or more electrical components to be in electrical communication with the conductive material by placing the electrical components in the respective one or more recesses of the rail layer. The method also includes melting a sealing sheet on top of the rail layer and the electrical components to reinforce connections between the electrical components and the conductive material and to provide elemental protection. The method also includes placing the lid on top of the sealing sheet while the sealing sheet is warm, the lid configured to reinforce connections between the electrical components and the conductive material and to provide elemental protection.

Also described is a method for fabricating a circuit board. The method includes fabricating, using an additive manufacturing device, a trace layer, a gap layer onto the trace layer, and a sacrificial layer onto the gap layer, the gap layer being printed above the trace layer and not directly onto the trace layer such that extruded filament from the additive manufacturing device cools before touching the trace layer and creating a non-permanent bond to the trace layer. The method also includes fabricating, using the additive manufacturing device, a rail layer. The method also includes depositing a conductive material on top of the sacrificial layer and a plurality of traces of the trace layer. The method also includes breaking the non-permanent bond established by the gap layer to remove the sacrificial layer from the trace layer. The method also includes placing the rail layer on top of the trace layer such that the plurality of raised traces of the trace layer align with a corresponding plurality of openings of the rail layer.

BRIEF DESCRIPTION OF THE DRAWINGS

Other systems, methods, features, and advantages of the present invention will be apparent to one skilled in the art upon examination of the following figures and detailed description. Component parts shown in the drawings are not necessarily to scale, and may be exaggerated to better illustrate the important features of the present invention.

FIGS. 5A-5C illustrate use of a pin stopper, according to various embodiments of the invention.

FIGS. 12A-12B illustrate an example process of fabricating a multilayer circuit board, according to various embodiments of the invention.

DETAILED DESCRIPTION

The novelty of the systems and methods described herein is a completely different additive approach to creating printed circuit boards (PCBs) than conventional methods. The materials are not wasted, as the plastic and liquid metal can be re-melted and used again. Furthermore, the sacrificial layer can be reused given that it is not damaged in the removal process. The materials used, plastic and liquid metal, are completely non-toxic, unlike traditional PCB fabrication methods. This increases the applications that PCBs can be used. For example, PCBs made through the systems and methods described herein can be used in water that people and animals drink.

The systems and methods described herein have significantly lower costs associated with manufacture of circuit boards and can be done in-house and by amateurs. To make a PCB through the systems and methods described herein, a 3D printer, filaments, and liquid metal (e.g., tin and gallium) are required. 3D printers can be purchased for under $1,000 and the plastic filaments arrive in large spools for typically less than $25. The driving cost for this method is the liquid metal (e.g., gallium). However, as will be described herein, the traces that are printed are thin, and this allows for a small amount of liquid metal to create many traces. The biggest potential waste for the liquid metal is the liquid metal that is disposed on the sacrificial layer during fabrication. However, the liquid metal may be removed from the sacrificial layer and used again. In some embodiments, the sacrificial layer covered in liquid metal may be submerged in a solution (e.g., NaOH), and the liquid metal may be rinsed off of the sacrificial layer.

As the systems and methods described herein use additive manufacturing, which may be referred to as "printing," the resulting circuit boards are true "printed circuit boards."

The systems and methods described herein design and fabricate at least three parts for each printed circuit board— the trace, the sacrificial layer, and the rail layer. In addition, a lid may be fabricated, which may be used to create a more robust package and a higher yield of functioning. A computer aided design (CAD) software such as SketchUp™ by Trimble, Inc. is used to design the traces, sacrificial layers, and rail layers.

FIGS. 1A-1L illustrate the various components and assemblies of components that result in a circuit board using the systems and methods described herein.

Figure 1A:
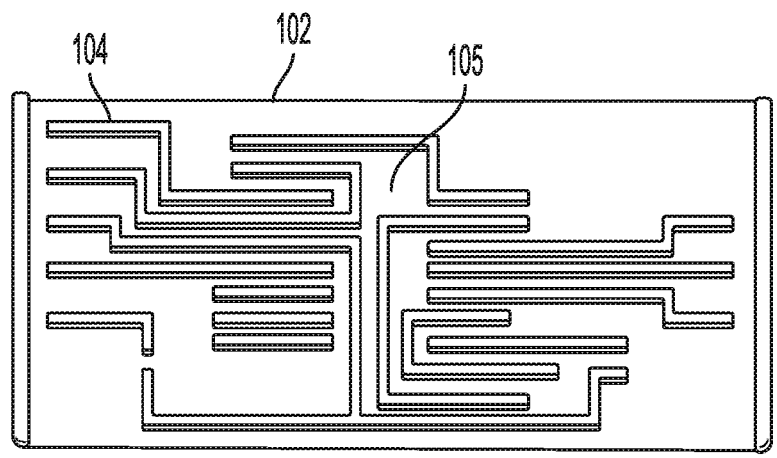
FIGS. 1A-1L illustrate components and assembly of the components into a circuit board, according to various embodiments of the invention.

FIG. 1A illustrates a trace layer 102. The trace layer 102 has a plurality of raised traces 104. Between the raised traces 104 are valleys 105. Any of the trace layers, sacrificial layers, rail layers, lids, or any other circuit board component described herein may be manufactured using additive manufacturing. In some embodiments, a 3D printer, such as a MakerGear™ M2 3D printer, is used. The 3D printer may include a nozzle and a reservoir of material. For example, a 0.25 mm nozzle and 1.75 mm polyethylene terephthalate glycol (PETG) may be dispensed by the 3D printer at a 0.1 mm height increment. The printer filament type and nozzle head size may be varied to achieve greater detail and robustness of a design. PETG is not conductive, inexpensive, and capable of being extruded to the level of detail needed to print the board pieces. While 3D printing is described herein, any additive manufacturing process may be used, including vat polymerization, powder bed fusion, binder jetting, material jetting, sheet lamination, material extrusion, directed energy deposition, or a combination of laser material deposition and CNC machining. The additive manufacturing process may use materials that are non-toxic and/or materials that may be reused.

Figure 1B:
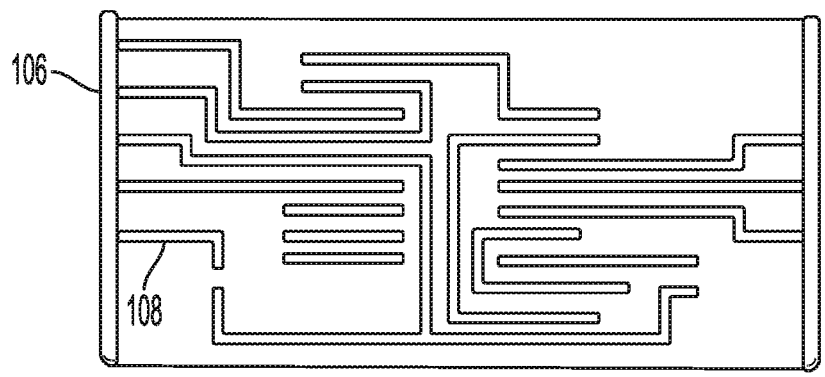

FIG. 1B illustrates a sacrificial layer 106. The sacrificial layer 106 has a plurality of openings 108 that correspond to the shape of the traces 104 of the trace layer 102. The sacrificial layer 106 is configured to be placed on top of the trace layer 102 such that the traces 104 of the trace layer 102 protrude from the openings 108 of the sacrificial layer 106. In this way, the sacrificial layer 106 is a stencil for the trace layer 102. The sacrificial layer 106 may be manufactured using additive manufacturing, similar to the trace layer 102.

Figure 1C:
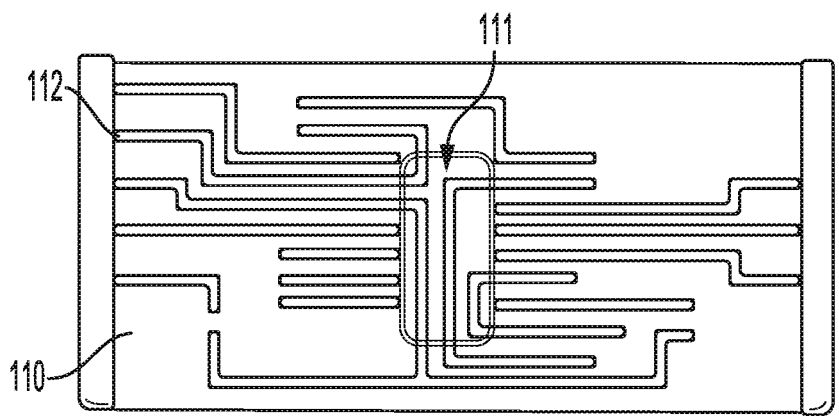

FIG. 1C illustrates a rail layer 110. The rail layer 110 also includes a plurality of openings 112 that correspond to the shape of the traces 104 of the trace layer 102. The rail layer 110 is also configured to be placed on top of the trace layer 102 such that the traces 104 of the trace layer 102 protrude from the openings 112 of the rail layer 110. The rail layer 110 may be manufactured using additive manufacturing, similar to the trace layer 102 and the sacrificial layer 106.

Figure 1D:
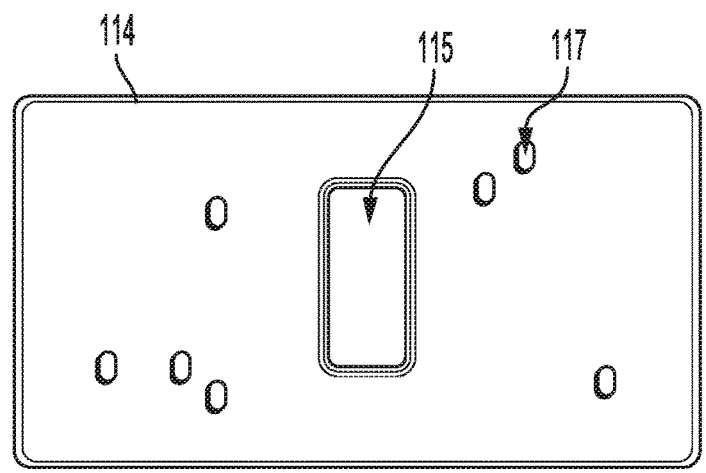

FIG. 1D illustrates a bottom side of a lid 114, which may be placed on top of the circuit board to protect the circuit board. The bottom side of the lid 114 may include recesses 115 configured to receive electrical components placed on the circuit board. The bottom side of the lid 114 may also include protrusions 117 configured to contact electrical components that are located deeper within the circuit board.

Figure 1E:
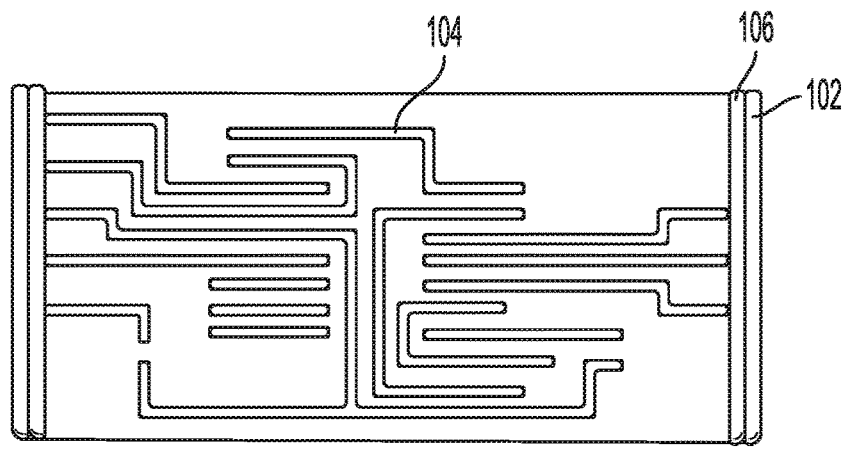

FIG. 1E illustrates the sacrificial layer 106 placed on top of the trace layer 102. The traces 104 of the trace layer 102 protrude from the openings 108 of the sacrificial layer 106. Thus, the traces 104 of the trace layer 102 are exposed, while the valleys 105 of the trace layer 102 are covered by the sacrificial layer 106. In some embodiments, the sacrificial layer 106 and the trace layer 102 have corresponding features that allow the sacrificial layer 106 to securely fasten (or snap) to the trace layer 102 such that vertical and/or horizontal movement of the sacrificial layer 106 relative to the trace layer 102 is limited.

Figure 1F:
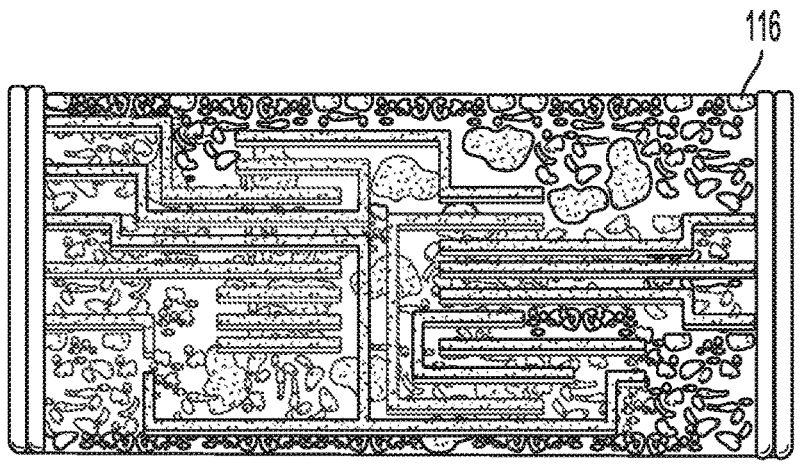

FIG. 1F illustrates a conductive material 116 brushed onto the sacrificial layer 106 that is on top of the trace layer 102. Thus, the conductive material 116 is disposed on top of the sacrificial layer 106 and the traces 104 of the trace layer 102. The conductive material 116 may be a liquid metal, such as liquid tin or gallium. In some embodiments, the ratio of gallium to tin is 2:1.

Figure 1G:
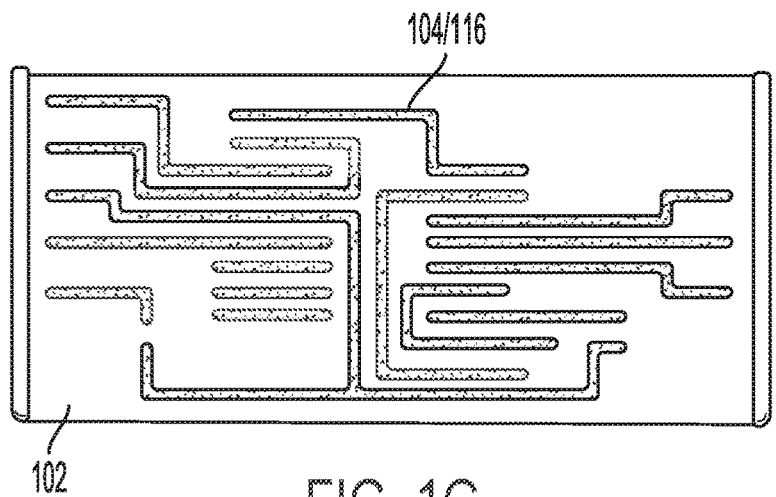

FIG. 1G illustrates the trace layer 102 after the sacrificial layer 106 has been removed. The trace layer 102 has conductive material 116 covering the traces 104, but not the valleys 105. The sacrificial layer 106 ensures that the conductive material 116 covers only the traces 104. The conductive material 116 remains on the traces 104 due to surface tension. As the sacrificial layer 106 is rigid, the removal of the sacrificial layer 106 from the top of the trace layer 102 is simple and clean. The sacrificial layer 106 may be reused in subsequent fabrications of subsequent circuit boards. In some embodiments, the conductive material is removed from the sacrificial layer 106 and the sacrificial layer 106 is melted and then placed into a reservoir of additive manufacturing material for later use. In this way, the systems and methods described herein are more sustainable than conventional fabrication methods, as components may be reused.

Figure 1H:
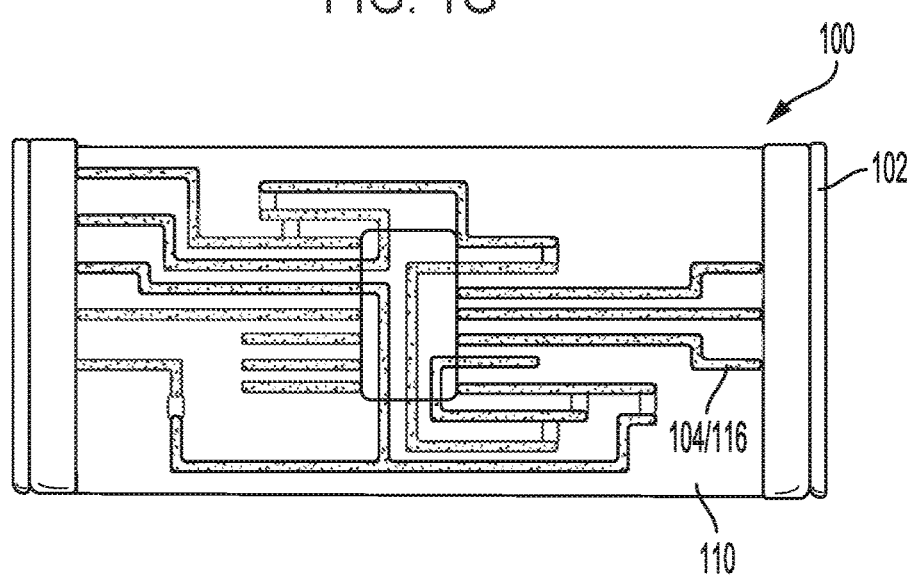

FIG. 1H illustrates the rail layer 110 placed on top of the trace layer 102. The openings 112 of the rail layer 110 allow the traces 104 covered with the conductive material 116 to be exposed. Thus, the rail layer 110 serves as a filler for the valleys 105 of the trace layer 102. As will be shown in FIGS. 2A-2L, the rail layer 110 is configured to support insertion of pin headers. In some embodiments, the rail layer 110 and the trace layer 102 have corresponding features that allow the rail layer 110 to securely fasten (or snap) to the trace layer 102 such that vertical and/or horizontal movement of the rail layer 110 relative to the trace layer 102 is limited. The rail layer 110 also has recessed cavities 111 for electronic surface mount components to be placed on the traces, as well as pin holders that align with the pin holders of the trace layer.

Figure 1I:
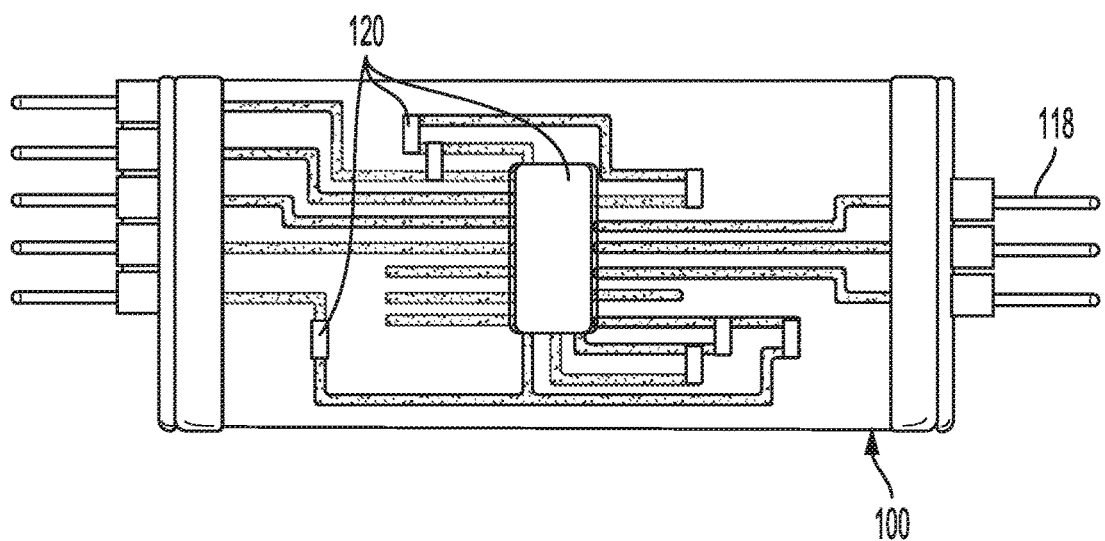

FIG. 1I illustrates pin headers 118 and electrical components 120, such as transistors, inserted and connected to the circuit board 100. The dimensions of the pin holders are designed so that the pin headers fit tightly. The pin headers have the added benefit of keeping the trace and rail layers together. Surface mounted elements can be easily placed in the recessed cavities 111 of the rail layer 110 to form a complete circuit. While pin headers are shown herein, in some embodiments, a female header or header connector configured to receive a male pin may be attached to the circuit board 100 instead. In these embodiments, one end of a male pin is connected to the conductive material covered traces and the other end of the male pin protrudes out of the circuit board 100 and may be received by a female header.

Figure 1J:
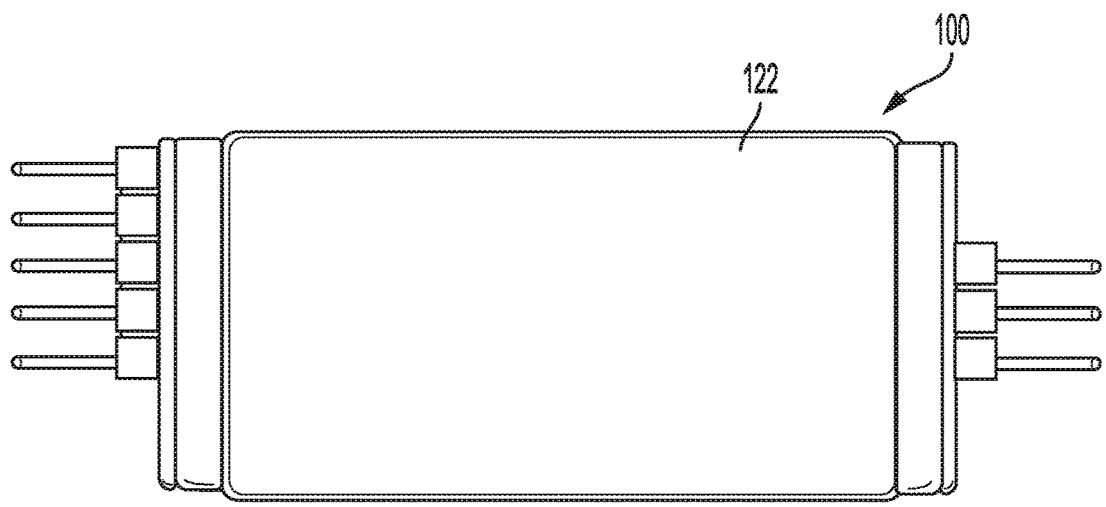

FIG. 1J illustrates placement of a sealing sheet 122 on top of the circuit board 100. The sealing sheet 122 may be made of the same material that the trace layer 102, the sacrificial layer 106 and/or the rail layer 110 is made of. In other embodiments, the sealing sheet 122 is made of a material that is different from the trace layer 102, the sacrificial layer 106 and/or the rail layer 110. In some embodiments, the sealing sheet 122 is made of polycaprolactone (PCL).

Figure 1K:
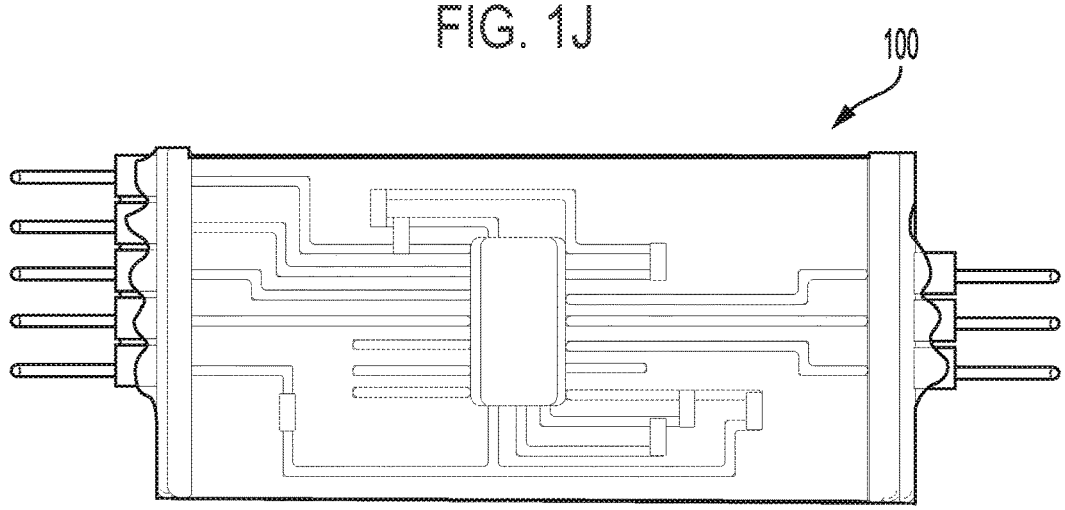

FIG. 1K illustrates the resulting circuit board 100 after the sealing sheet 122 is heated. When the sealing sheet 122 is heated, the sealing sheet 122 covers and molds to the features of the circuit board 100. The sealing sheet 122 also provides downward force on the components to ensure they are secured. In some embodiments, the sealing sheet 122 is larger than the dimensions of the circuit board 100, such that an overhang of the sealing sheet 122 molds with the pin headers 118, further keeping the pin headers 118 in place.

If a waterproof design is required, a second sealing sheet can be applied to the back of the board, covering all crevices. A thermoplastic with a higher melting point can be used in place of PCL to accommodate circuits that generate more heat.

Figure 1L:
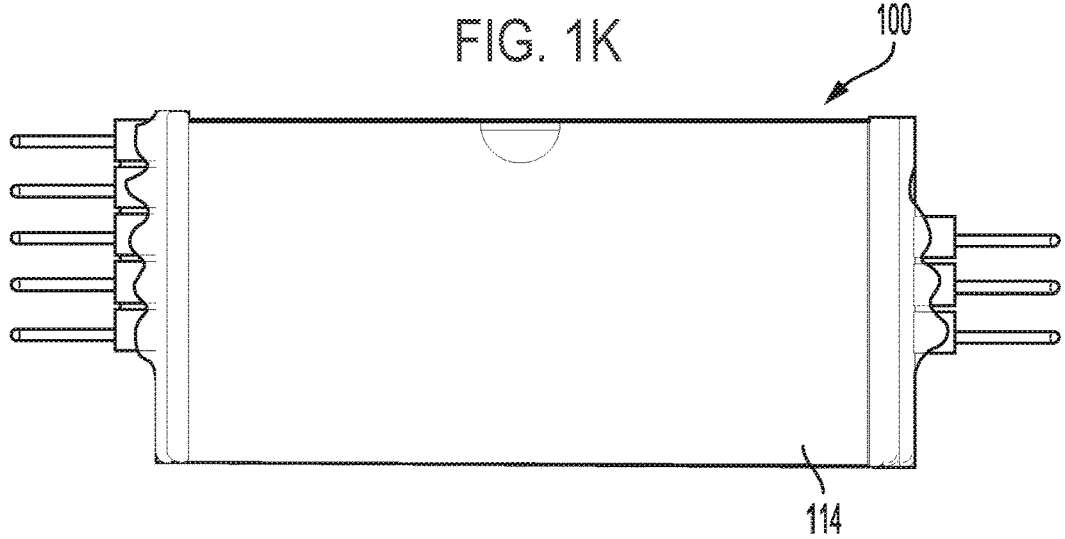

FIG. 1L illustrates the placement of the lid 114 on top of the circuit board 100 and covering the circuit board 100. When the lid 114 is placed on top of the circuit board 100 and pressed down while the sealing sheet 122 remains warm, the lid 114 may form an additional seal over the circuit board 100, protecting the components of the circuit board 100 from debris and/or liquid. The lid 114 may bond with the sealing sheet 122. The lid 114 may also provide a downward force on the electrical components 120 to maintain reliable and consistent contacts with the conductive material 116. The lid 114 may account for the electrical components 120 by including corresponding recesses on a bottom surface of the lid 114 to receive the electrical components 120 and/or protrusions on the bottom surface of the lid 114 to contact electrical components located deeper (or lower) in the circuit board.

FIGS. 2A-2L illustrate side cross-sectional views of the circuit board 100 corresponding to the views shown in FIGS. 1A-1L. The number measurements illustrated in FIGS. 2A-2L are illustrative of a particular embodiment created using the systems and methods described herein and are not limiting.

Figure 2A:
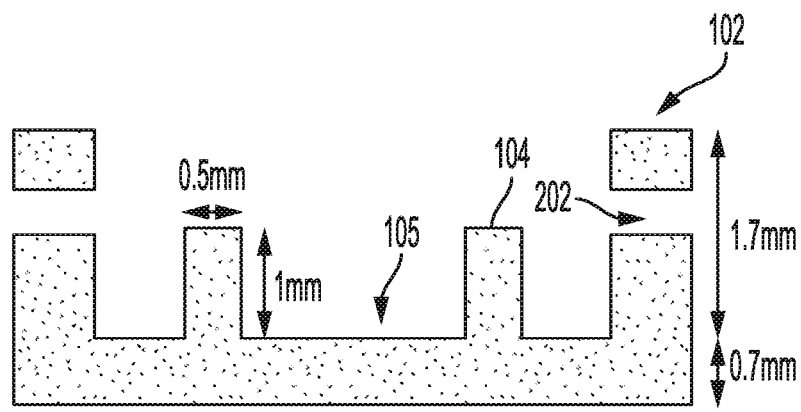
FIGS. 2A-2L illustrate side cross-sectional views of the components and assemblies of FIGS. 1A-1L, according to various embodiments of the invention.

FIG. 2A illustrates a side cross-sectional view of the trace layer 102 with a plurality of raised traces 104. The traces 104 are elevated paths on which the liquid metal rests. Between the raised traces 104 are valleys 105. Also shown are pin header holders 202 which are located on the sides of the circuit board. The pin header holders 202 are hollow channels that align with the metal traces. They guide the pin headers to the metal traces to form a secure contact during the final assembly.

Figure 2B:
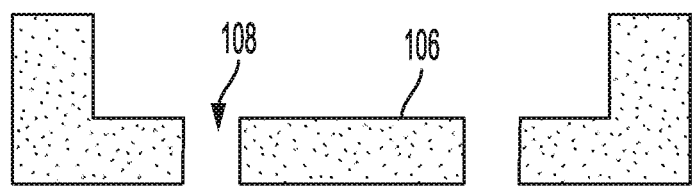

FIG. 2B illustrates a side cross-sectional view of the sacrificial layer 106. The sacrificial layer 106 has a plurality of openings 108 that correspond to the shape of the traces 104 of the trace layer 102. The sacrificial layer 106 is configured to be placed on top of the trace layer 102 such that the traces 104 of the trace layer 102 protrude from the openings 108 of the sacrificial layer 106. The sacrificial layer 106 may be manufactured using additive manufacturing, similar to the trace layer 102.

Figure 2C:
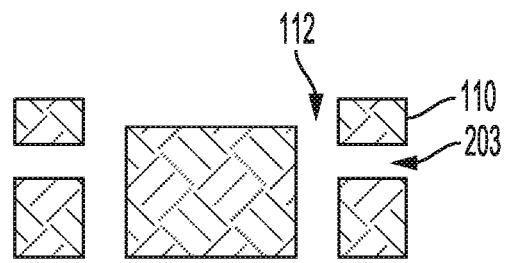

FIG. 2C illustrates a side cross-sectional view of the rail layer 110. The rail layer 110 also includes a plurality of openings 112 that correspond to the shape of the traces 104 of the trace layer 102. The rail layer 110 is also configured to be placed on top of the trace layer 102 such that the traces 104 of the trace layer 102 protrude from the openings 112 of the rail layer 110. The rail layer 110 may be manufactured using additive manufacturing, similar to the trace layer 102 and the sacrificial layer 106. While the sacrificial layer 106 and the rail layer 110 appear similar from the perspective views of FIGS. 1B and 1C, the side cross-sectional views show that the rail layer 110 is thicker than the sacrificial layer 106 and also include pin header openings 203 for receiving pin headers.

Figure 2D:
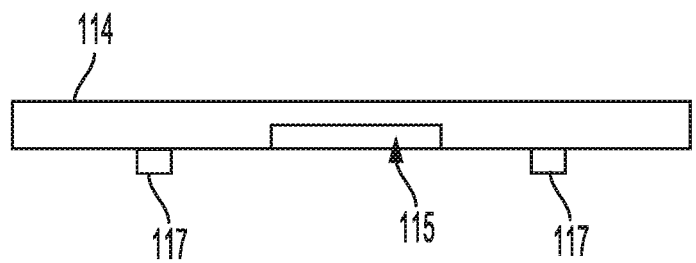

FIG. 2D illustrates a side cross-sectional view of the lid 114, which may be placed on top of the circuit board to protect the circuit board. As described herein, the lid 114 may include recesses 115 and protrusions 117.

Figure 2E:
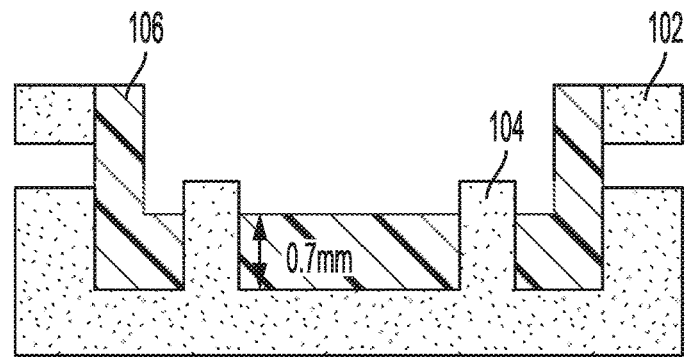

FIG. 2E illustrates a side cross-sectional view of the sacrificial layer 106 placed on top of the trace layer 102. The traces 104 of the trace layer 102 protrude from the openings 108 of the sacrificial layer 106. Thus, the traces 104 of the trace layer 102 are exposed, while the valleys 105 of the trace layer 102 are covered by the sacrificial layer 106.

Figure 2F:
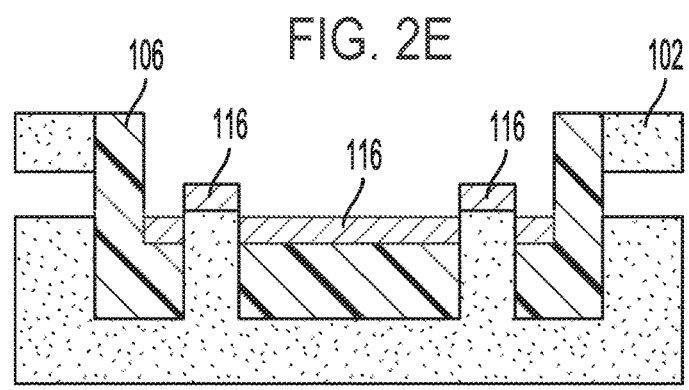

FIG. 2F illustrates a side cross-sectional view of the conductive material 116 brushed onto the sacrificial layer 106 that is on top of the trace layer 102. Thus, the conductive material 116 is disposed on top of the sacrificial layer 106 and the traces 104 of the trace layer 102.

Figure 2G:
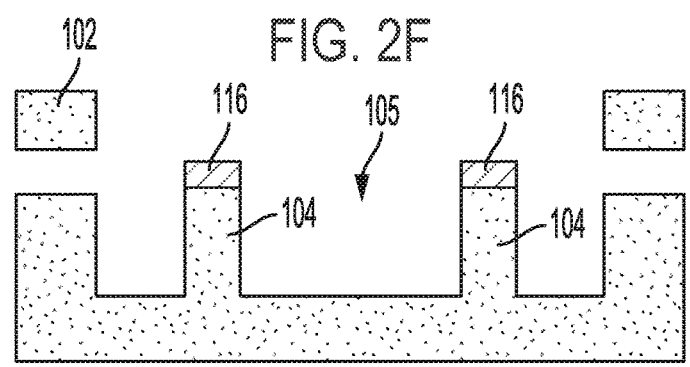

FIG. 2G illustrates a side cross-sectional view of the trace layer 102 after the sacrificial layer 106 has been removed. The trace layer 102 has conductive material 116 covering the traces 104, but not the valleys 105.

Figure 2H:
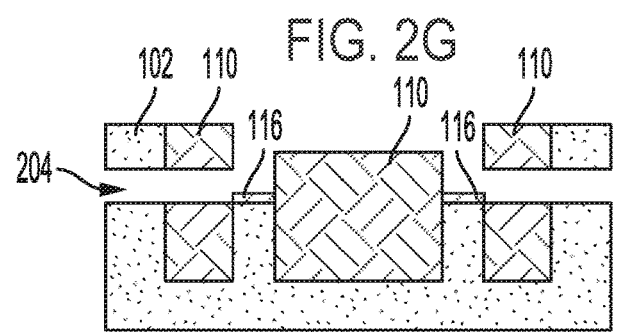

FIG. 2H illustrates a side cross-sectional view of the rail layer 110 placed on top of the trace layer 102. The openings 112 of the rail layer 110 allow the traces 104 covered with the conductive material 116 to be exposed. Thus, the rail layer 110 serves as a filler for the valleys 105 of the trace layer 102. The openings 203 of the rail layer 110 line up with the openings 202 of the trace layer 102, forming pin header openings 204.

Figure 2I:
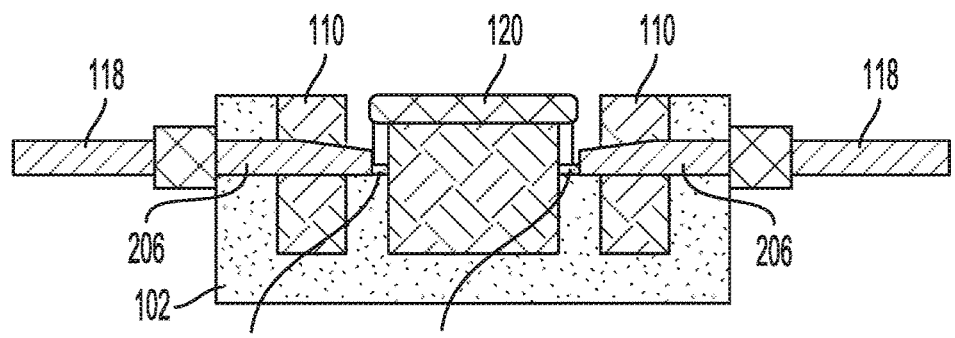

FIG. 2I illustrates a side cross-sectional view of pin headers 118 and electrical components 120, such as transistors, inserted and connected to the circuit board 100. The electrical components 120 are in electrical communication with the conductive material 116 covering the traces 104. The conductive material 116 covering the traces 104 are also in electrical communication with the pins 206 of the pin headers 118. The pins 206 of the pin headers 118 are received by the pin header openings 204.

Figure 2J:
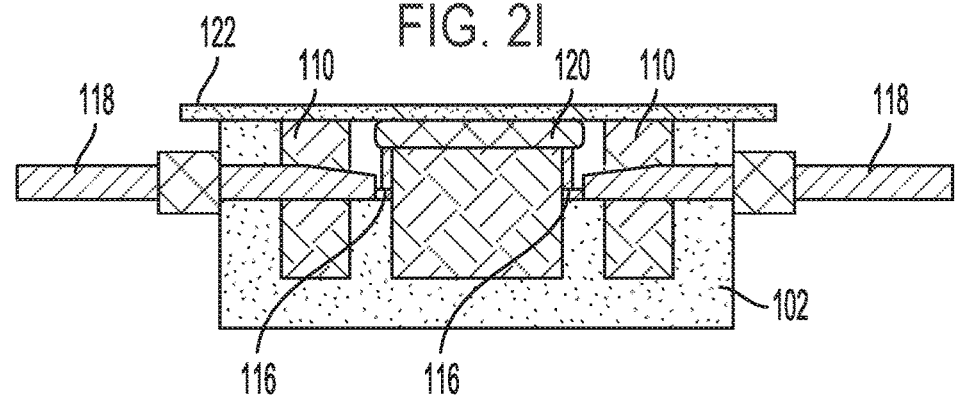

FIG. 2J illustrates a side cross-sectional view of the placement of a sealing sheet 122 on top of the circuit board 100.

Figure 2K:
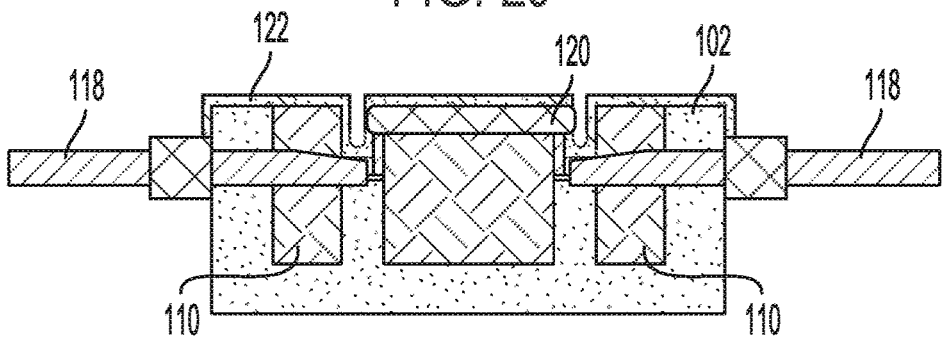

FIG. 2K illustrates a side cross-sectional view of the resulting circuit board 100 after the sealing sheet 122 is heated. When the sealing sheet 122 is heated, the sealing sheet 122 covers and molds to the features of the circuit board 100.

Figure 2L:
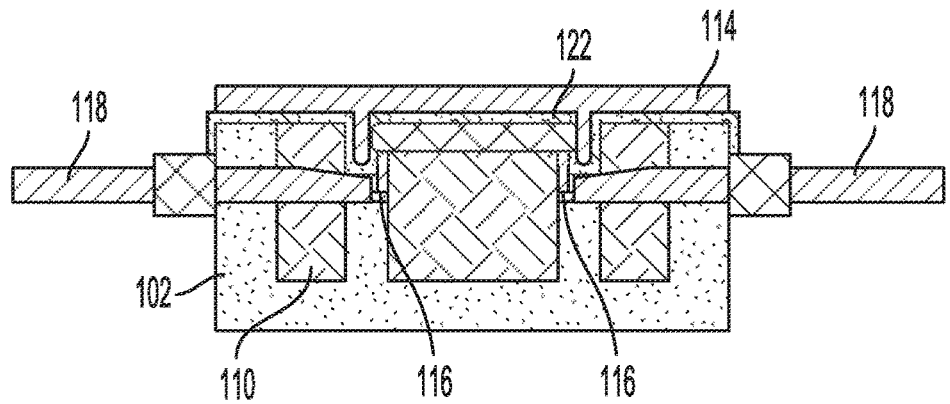

FIG. 2L illustrates a side cross-sectional view of the placement of the lid 114 on top of the circuit board 100 and covering the circuit board 100. The lid 114 and the sealing sheet 122 protect the circuit board 100 and provide additional pressure and stability to maintain the connections in the circuit board 100.

In addition to the single-layer circuit board illustrated in FIGS. 1A-1L and 2A-2L, multilayer circuit boards may also be fabricated using the systems and methods described herein. The multiple layers of the multilayer circuit boards are connected using vias. The vias used in the systems and methods described herein are equivalent to traditional PCB vias.

FIGS. 3A-3O and FIGS. 4A-4L illustrate a process of fabricating a multilayer circuit board using the systems and methods described herein. In a similar manner as described herein with respect to the trace layer 102, the sacrificial layer 106, the rail layer 110, and the lid 114, a first trace layer 302 (shown in FIG. 3A), a second trace layer 306 (shown in FIG. 3B), a sacrificial layer 310 (shown in FIG. 3C), a rail layer 314 (shown in FIG. 3D), and a lid 318 (shown in FIG. 3E) are fabricated using additive manufacturing.

Figure 3A:
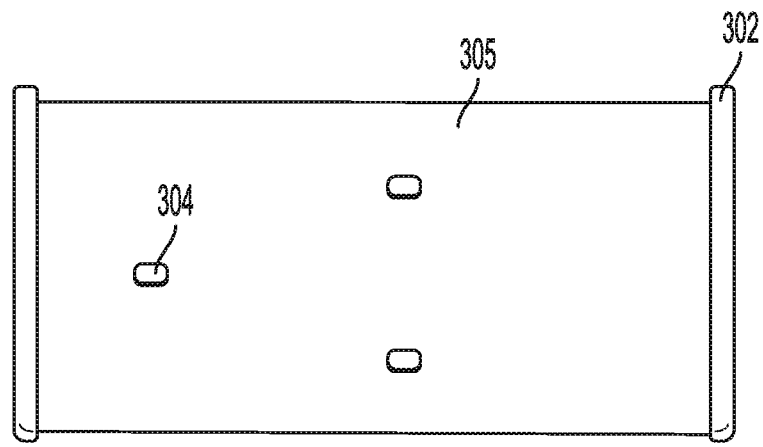
FIGS. 3A-3O illustrate components and assembly of the components into a multilayer circuit board, according to various embodiments of the invention.
Figure 3B:
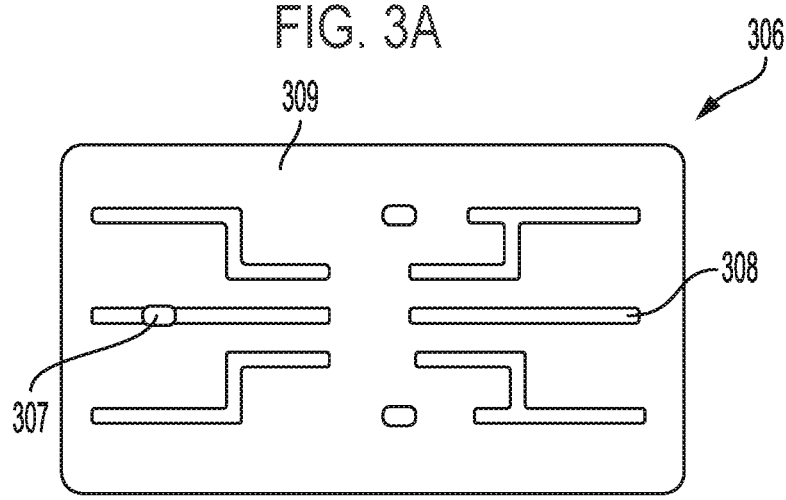

As illustrated in FIG. 3A, the first trace layer 302 has a plurality of vias 304 and valleys 305. As illustrated in FIG. 3B, the second trace layer 306 also has a plurality of traces 308 and a plurality of valleys 309, similar to trace layer 102. The second trace layer 306 also includes openings 307 to receive the vias 304 of the first trace layer 302. The vias 304 will connect the first trace layer 302 with the second trace layer 306.

Figure 3C:
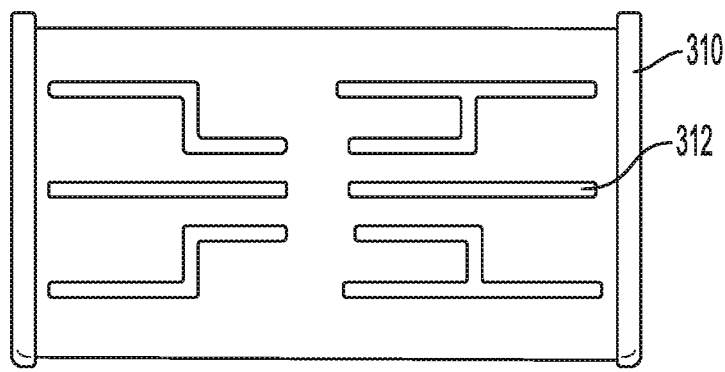

As illustrated in FIG. 3C, the sacrificial layer 310 has a plurality of openings 312 that correspond to the shape of the traces 308 of the second trace layer 306. In some embodiments, an additional sacrificial layer may be fabricated and used that has openings that correspond to the vias 304 of first trace layer 302. This will be shown in FIGS. 4B-4C.

Figure 3D:
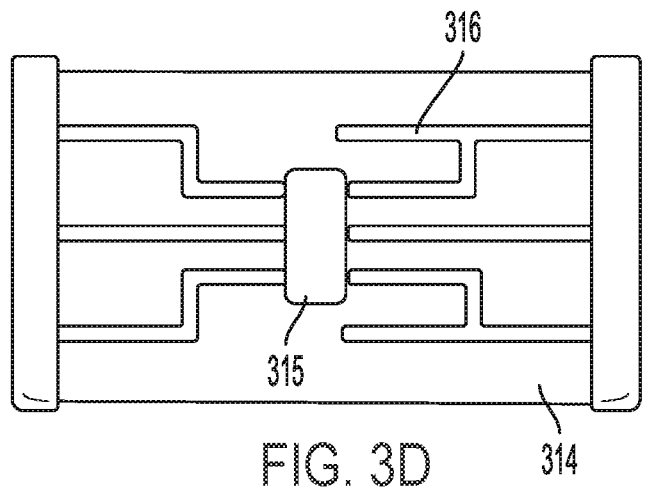

As illustrated in FIG. 3D, the rail layer 314 has a plurality of openings 316. The rail layer 314 will be placed on top of the second trace layer 306, which will be placed on top of the first trace layer 302. Accordingly, the openings 316 of the rail layer 314 correspond to the shape of the traces formed when the second trace layer 306 and the first trace layer 302 are combined. The rail layer 314 includes cavities 315 configured to receive electrical components.

Figure 3E:
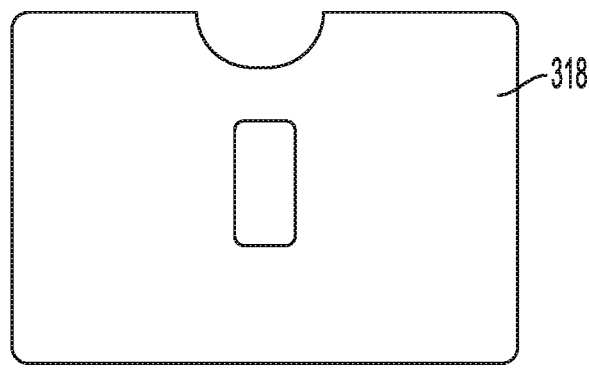

FIG. 3E illustrates the lid 318. If the electrical components form recessed cavities with the rail layer 314, the lid portion above the components will need to protrude out to fill the empty space and securely press the components onto the traces.

Figure 3F:
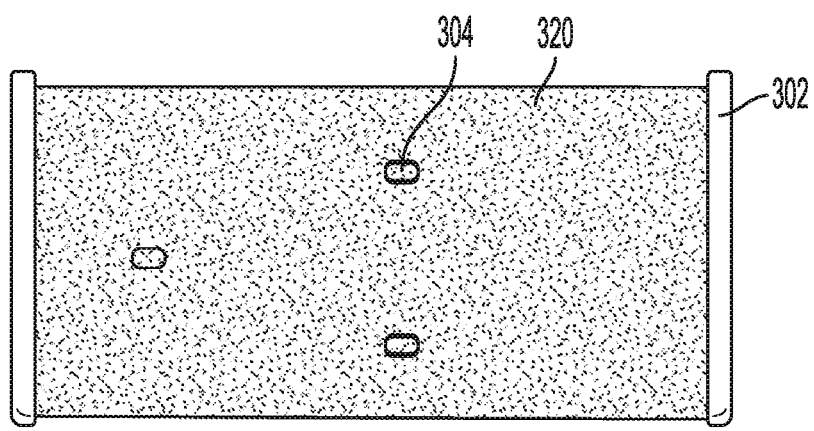

FIG. 3F illustrates a conductive material 320 brushed onto the first trace layer 302. In the example shown in FIGS. 3A-3O, the design is such that the first trace layer 302 serves as a ground plane and may have the conductive material 320 covering both the vias 304 and the valleys 305 of the first trace layer 302, but in other situations, a separate sacrificial layer may be used for the first trace layer 302. As described herein, the conductive material 320 may be a liquid metal, such as liquid tin or gallium. In some embodiments, the ratio of gallium to tin is 2:1.

Figure 3G:
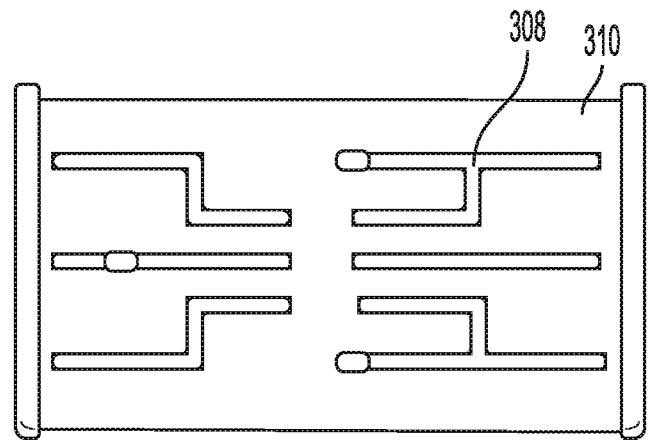

FIG. 3G illustrates the sacrificial layer 310 placed on top of the second trace layer 306. The traces 308 of the second trace layer 306 protrude from the openings 312 of the sacrificial layer 310. Thus, the traces 308 of the second trace layer 306 are exposed, while the valleys 309 of the second trace layer 306 are covered by the sacrificial layer 310. In some embodiments, the sacrificial layer 310 and the second trace layer 306 have corresponding features that allow the sacrificial layer 310 to securely fasten (or snap) to the second trace layer 306 such that vertical and/or horizontal movement of the sacrificial layer 310 relative to the second trace layer 306 is limited.

Figure 3H:
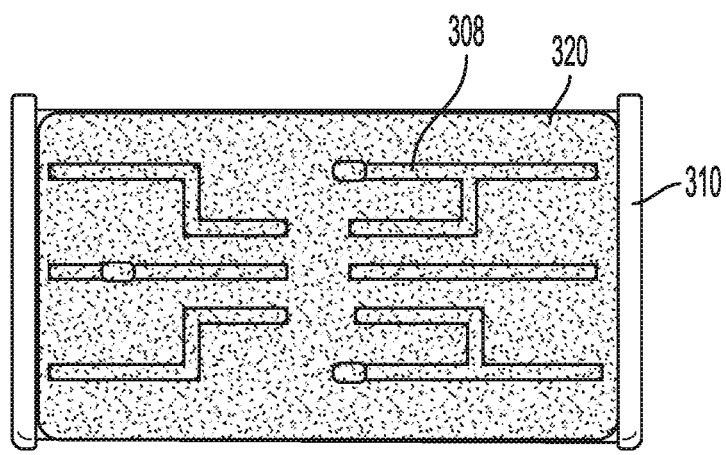

FIG. 3H illustrates the conductive material 320 brushed onto the sacrificial layer 310 that is on top of the second trace layer 306. Thus, the conductive material 320 is disposed on top of the sacrificial layer 310 and the traces 308 of the second trace layer 306.

Figure 3I:
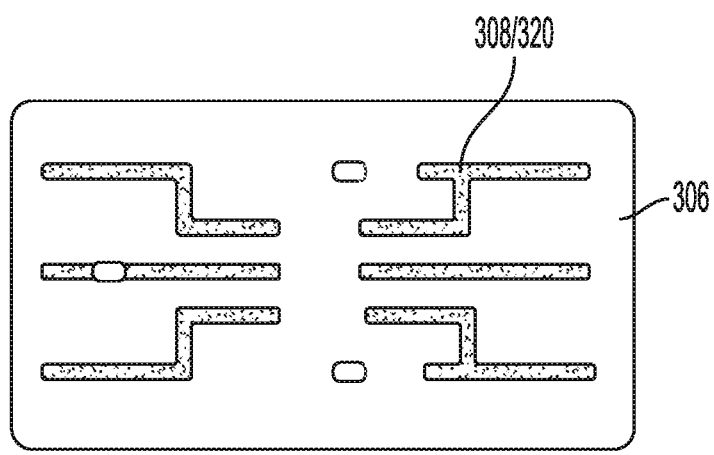

FIG. 3I illustrates the second trace layer 306 after the sacrificial layer 310 has been removed. The second trace layer 306 has conductive material 320 covering the traces 308, but not the valleys 309. The sacrificial layer 310 ensures that the conductive material 320 covers only the traces 308. The conductive material 320 remains on the traces 308 due to surface tension. As the sacrificial layer 310 is rigid, the removal of the sacrificial layer 310 from the top of the second trace layer 306 is simple and clean. The sacrificial layer 310 may be reused in subsequent fabrications of subsequent circuit boards. In some embodiments, the conductive material is removed from the sacrificial layer 310 and the sacrificial layer 310 is melted and then placed into a reservoir of additive manufacturing material for later use. In this way, the systems and methods described herein are more sustainable than conventional fabrication methods, as components may be reused.

Figure 3J:
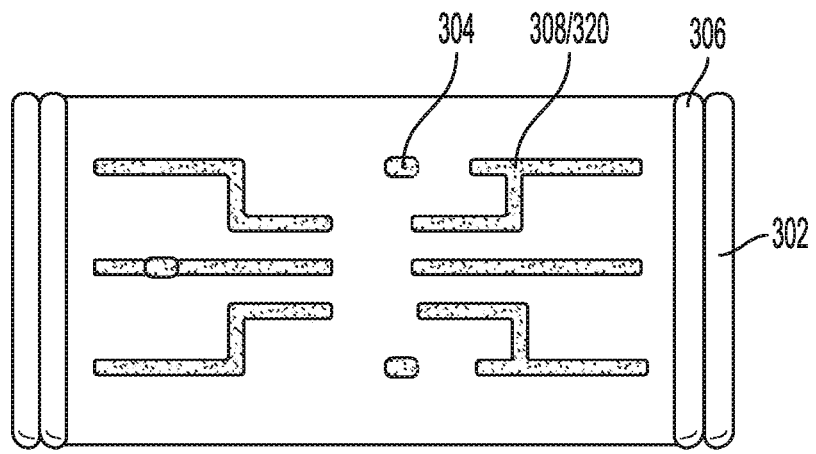

FIG. 3J illustrates the second trace layer 306 placed on the first trace layer 302. In some embodiments, the first trace layer 302 and the second trace layer 306 have corresponding features that allow the first trace layer 302 to securely fasten (or snap) to the second trace layer 306 such that vertical and/or horizontal movement of the first trace layer 302 relative to the second trace layer 306 is limited. As will be better shown in FIGS. 4A-4L, the vias 304 of the first trace layer 302 connect to traces 308 of the second trace layer 306, allowing for the multilayer design.

Figure 3K:
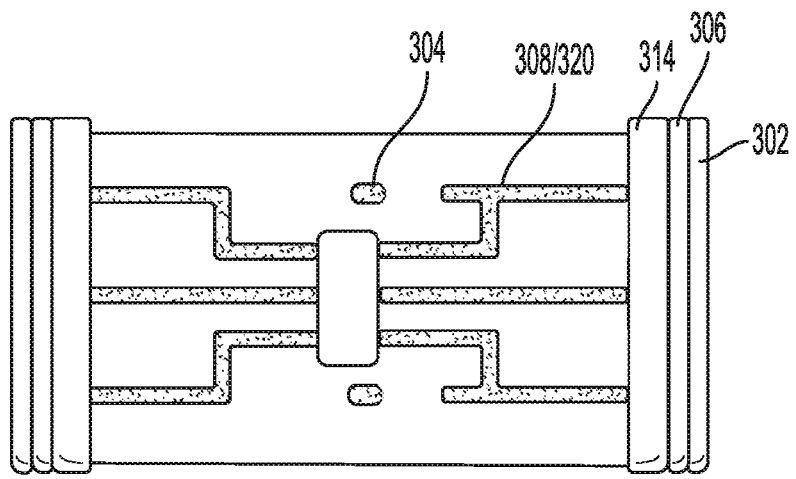

FIG. 3K illustrates the rail layer 314 placed on top of the second trace layer 306 on top of the first trace layer 302. The openings 316 of the rail layer 314 allow the traces 308 covered with the conductive material 320 to be exposed. Thus, the rail layer 314 serves as a filler for the valleys 309 of the second trace layer 306. As will be shown in FIGS. 4A-4L, the rail layer 314 is configured to support insertion of pin headers. In some embodiments, the rail layer 314 and the second trace layer 306 on top of the first trace layer 302 have corresponding features that allow the rail layer 314 to securely fasten (or snap) to the second trace layer 306 on top of the first trace layer 302 such that vertical and/or horizontal movement of the rail layer 314 relative to the second trace layer 306 on top of the first trace layer 302 is limited. The rail layer 314 also has recessed cavities 315 for electronic surface mount components to be placed on the traces, as well as pin holders that align with the pin holders of the trace layer.

Figure 3L:
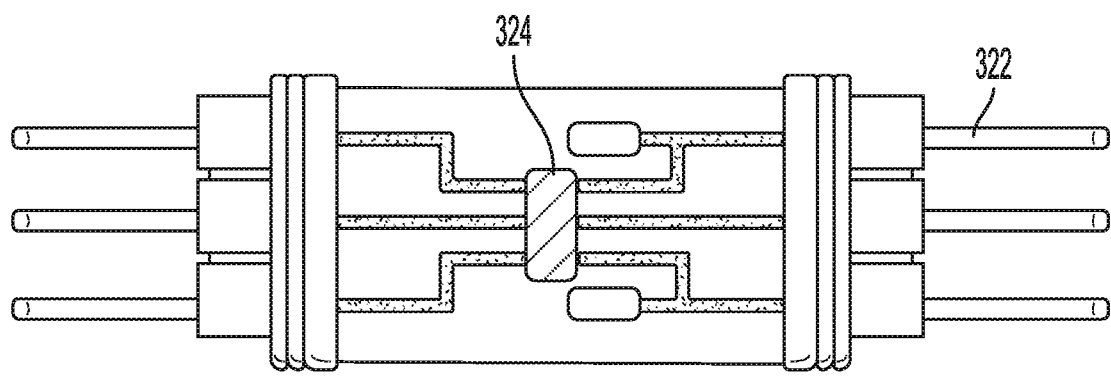

FIG. 3L illustrates pin headers 322 and electrical components 324, such as transistors, inserted and connected to the circuit board 300. The dimensions of the pin holders are designed so that the pin headers fit tightly. The pin headers have the added benefit of keeping the trace and rail layers together. Surface mounted elements can be easily placed in the recessed cavities 315 of the rail layer 314 to form a complete circuit.

Figure 3M:
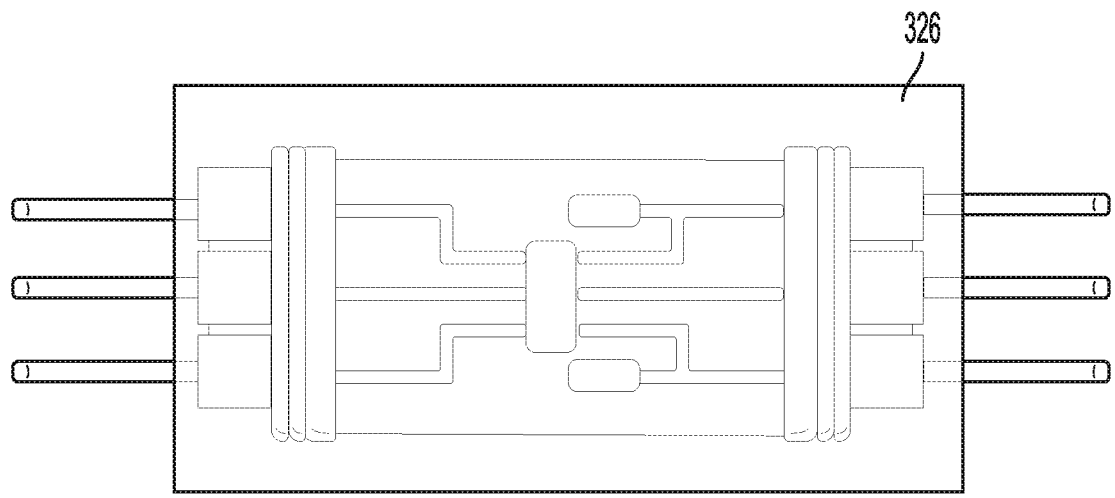

FIG. 3M illustrates placement of a sealing sheet 326 on top of the circuit board 300. The sealing sheet 326 may be made of the same material that the first trace layer 302, the second trace layer 306, the sacrificial layer 310 and/or the rail layer 314 is made of. In other embodiments, the sealing sheet 326 is made of a material that is different from the first trace layer 302, the second trace layer 306, the sacrificial layer 310 and/or the rail layer 314. In some embodiments, the sealing sheet 326 is made of polycaprolactone (PCL).

Figure 3N:
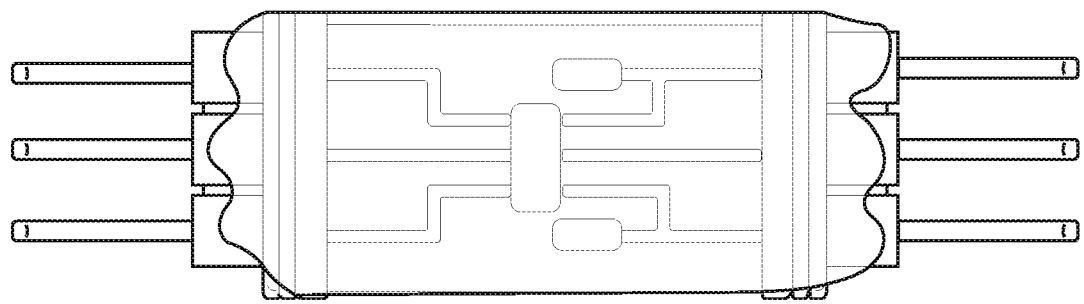

FIG. 3N illustrates the circuit board 300 after the sealing sheet 326 is heated. When the sealing sheet 326 is heated, the sealing sheet 326 covers and molds to the features of the circuit board 300. The sealing sheet 326 also provides downward force on the components to ensure they are secured. In some embodiments, the sealing sheet 326 is larger than the dimensions of the circuit board 300, such that an overhang of the sealing sheet 326 molds with the pin headers 322, further keeping the pin headers 322 in place.

If a waterproof design is required, a second sealing sheet can be applied to the back of the board, covering all crevices. A thermoplastic with a higher melting point can be used in place of PCL to accommodate circuits that generate more heat.

Figure 3O:
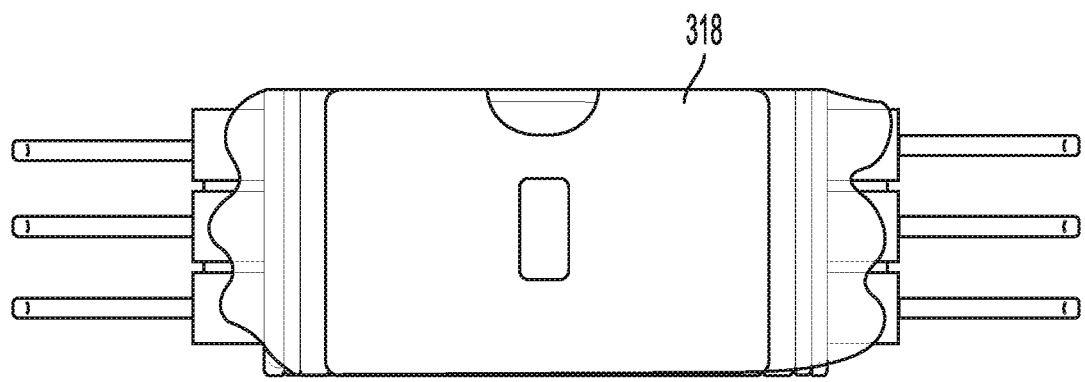

FIG. 3O illustrates the placement of the lid 318 on top of the circuit board 300 and covering the circuit board 300. When the lid 318 is placed on top of the circuit board 300 and pressed down while the sealing sheet 326 remains warm, the lid 318 may form an additional seal over the circuit board 300, protecting the components of the circuit board 300 from debris and/or liquid. The lid 318 may bond with the sealing sheet 326. The lid 318 may also provide a downward force on the electrical components 324 to maintain reliable and consistent contacts with the conductive material 320. The lid 318 may account for the electrical components 324 by including corresponding recesses on a bottom surface of the lid 318 to receive the electrical components 324 and/or protrusions on the bottom surface of the lid 318 to contact electrical components located deeper (or lower) in the circuit board.

FIGS. 4A-4L illustrate side cross-sectional views of the circuit board 300 shown in FIGS. 3A-3O. The number measurements illustrated in FIGS. 4A-4L are illustrative of a particular embodiment created using the systems and methods described herein and are not limiting.

Figure 4A:
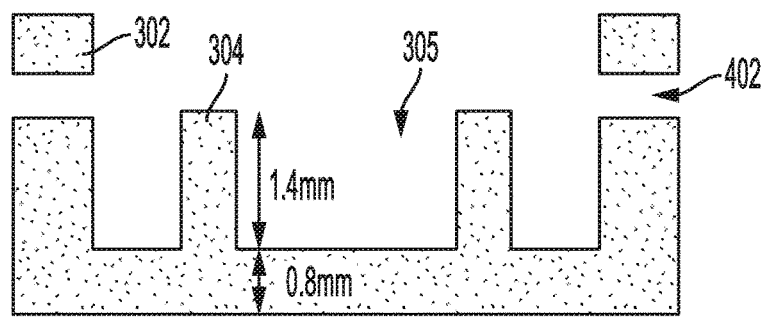
FIGS. 4A-4L illustrate select side cross-sectional views of the components and assemblies of FIGS. 3A-3O, according to various embodiments of the invention.

FIG. 4A illustrates a side cross-sectional view of the first trace layer 302 with a plurality of raised vias 304. The vias 304 are elevated paths on which the liquid metal rests. Between the raised vias 304 are valleys 305. Also shown are pin header holders 402 which are located on the sides of the circuit board. The pin header holders 402 are hollow channels that align with the metal traces. They guide the pin headers to the metal traces to form a secure contact during the final assembly.

Figure 4B:
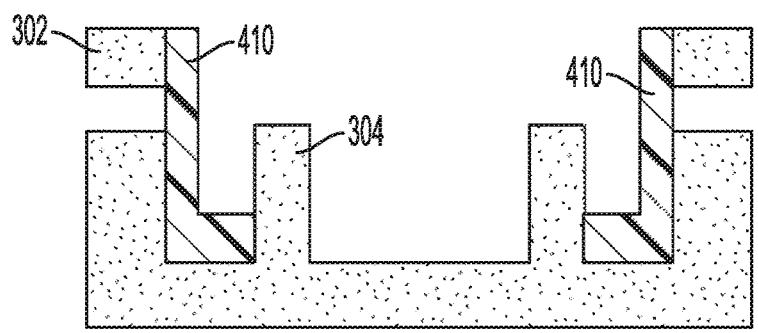

FIG. 4B illustrates a side cross-sectional view of an initial sacrificial layer 410. The initial sacrificial layer 410 has a plurality of openings that correspond to the shape of the vias 304 of the first trace layer 302. The initial sacrificial layer 410 is configured to be placed on top of the first trace layer 302 such that the vias 304 of the first trace layer 302 protrude from the openings of the initial sacrificial layer 410, and some of the valleys 305 are exposed. The initial sacrificial layer 410 may be manufactured using additive manufacturing, similar to the first trace layer 302. As described herein, in some situations, depending on the design of the multilayer circuit board, use of the initial sacrificial layer 410 may be optional.

Figure 4C:
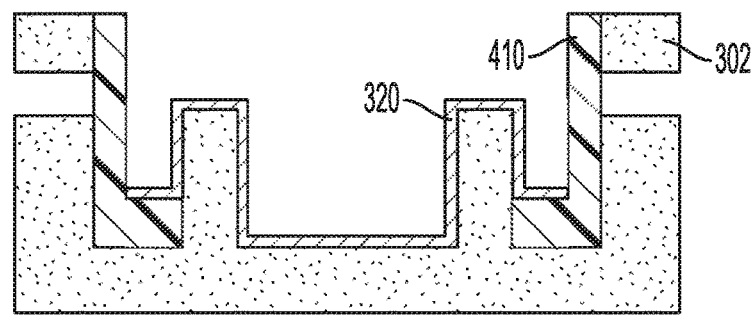

FIG. 4C illustrates a side cross-sectional view of the conductive material 320 brushed onto the initial sacrificial layer 410 that is on top of the first trace layer 302. Thus, the conductive material 320 is disposed on top of the initial sacrificial layer 410, on top of the vias 304, on some of the sides of the vias 304, and on some of the valleys 305. These conductive material 320 portions disposed on the sides of the vias 304 will connect the multiple layers of the multilayer circuit board.

Figure 4D:
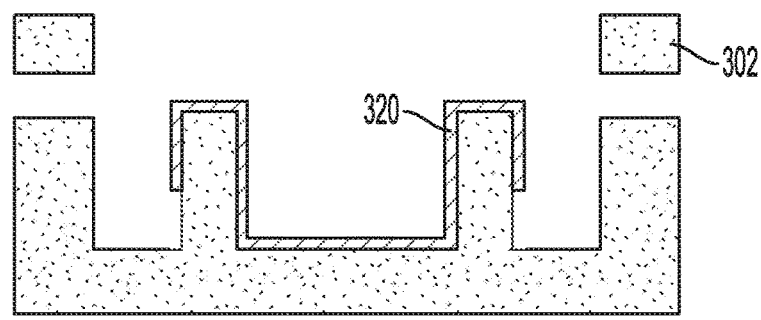

FIG. 4D illustrates a side cross-sectional view of the first trace layer 302 after the initial sacrificial layer 410 has been removed. The first trace layer 302 has conductive material 320 covering the tops and some sides of vias 304, as well as some of the valleys 305.

Figure 4E:
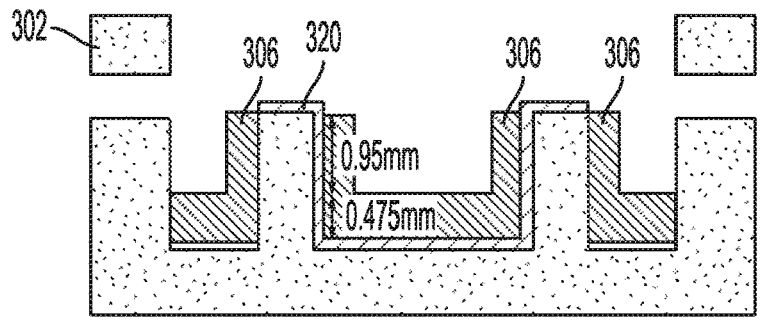

FIG. 4E illustrates a side cross-sectional view of the second trace layer 306 placed on top of the first trace layer 302. The vias 304 of the first trace layer 302 protrude from openings 307 in the second trace layer 306.

Figure 4F:
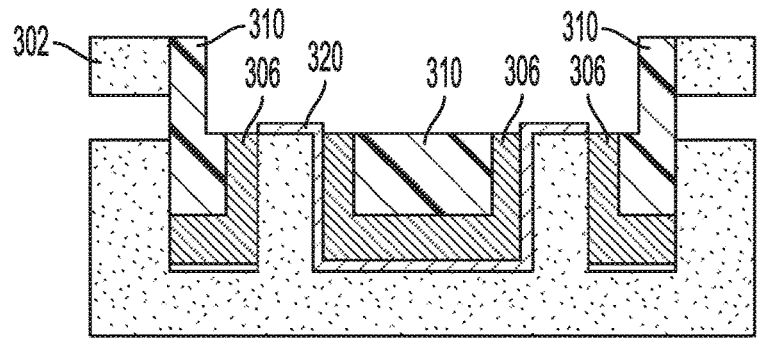

FIG. 4F illustrates a side cross-sectional view of the sacrificial layer 310 placed on top of the second trace layer 306. The vias 304 of the first trace layer 302 and the traces 308 of the second trace layer 306 both protrude from the openings 312 of the sacrificial layer 310. Thus, the vias 304 of the first trace layer 302 and the traces 308 of the second trace layer 306 (along with the conductive material 320 on top of the vias 304 of the first trace layer 302) are exposed, while the valleys 305 of the first trace layer 302 and the valleys 309 of the second trace layer 306 are covered by the sacrificial layer 310.

The height of the vias 304 is dependent on the thickness of the second trace layer 306. The first trace layer 302 and the second trace layer 306 must be designed such that the vias 304 and the traces 308 on the second trace layer 306 are the same height when combined. As shown in FIG. 4E, the second trace layer 306 is secured in place only when the vias 304 are snapped together with the second trace layer 306. Although for certain applications, electrical vias alone will suffice, additional supporting vias could be made for the purpose of improving board structure.

Figure 4G:
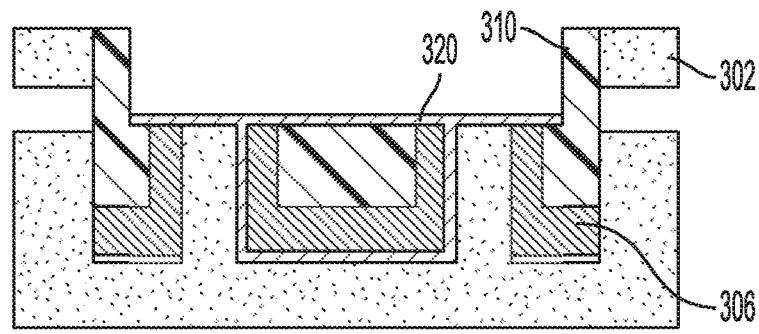

FIG. 4G illustrates a side cross-sectional view of the conductive material 320 brushed onto the sacrificial layer 310 that is on top of the first trace layer 302 and the second trace layer 306. Thus, the conductive material 320 is disposed on top of the sacrificial layer 310 and the vias 304 of the first trace layer 302 and the traces 308 of the second trace layer 306.

Figure 4H:
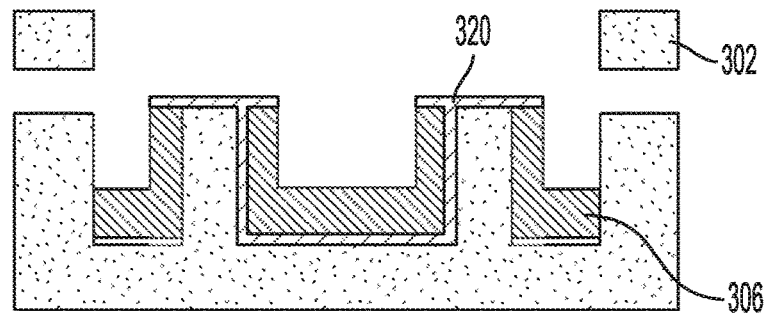

FIG. 4H illustrates a side cross-sectional view of the first trace layer 302 and the second trace layer 306 after the sacrificial layer 310 has been removed. The second trace layer 306 has conductive material 320 covering the traces 308, but not the valleys 309. The conductive material 320 on top of the second trace layer 306 is connected to the vias 304 and the conductive material 320 covering the valleys 305 of the first trace layer 302.

Figure 4I:
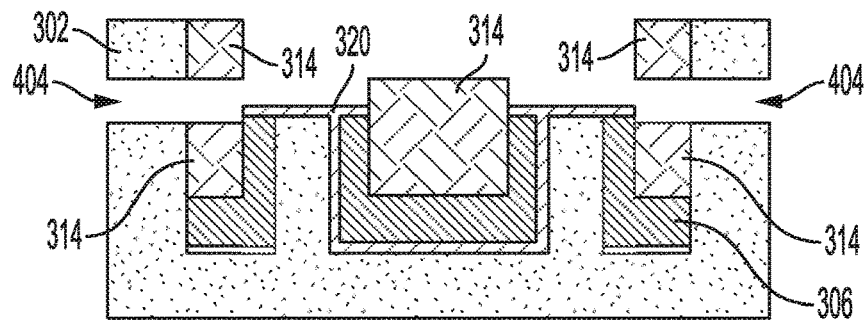

FIG. 4I illustrates a side cross-sectional view of the rail layer 314 placed on top of the first trace layer 302 and the second trace layer 306. FIG. 4I corresponds with FIG. 3K. The openings 316 of the rail layer 314 allow the vias 304 and traces 308 covered with the conductive material 320 to be exposed. The pin header openings of the rail layer 314 line up with the pin header holders 402 of the first trace layer 302, forming pin header openings 404.

Figure 4J:
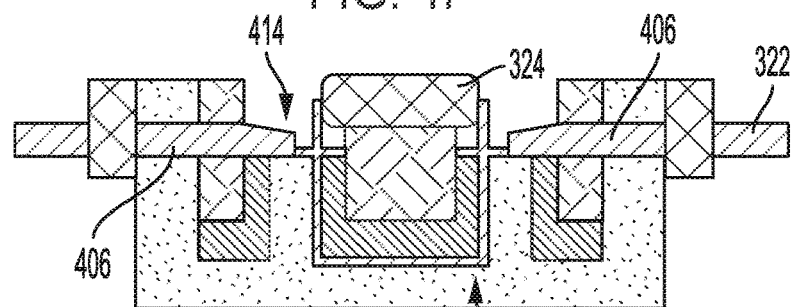

FIG. 4J illustrates a side cross-sectional view of pin headers 322 and electrical components 324, such as transistors, inserted and connected to the circuit board 300. FIG. 4J corresponds to FIG. 3L. The electrical components 324 are in electrical communication with the conductive material 320 covering the vias 304 of the first trace layer 302 and/or traces 308 of the second trace layer 306. The conductive material 320 covering the vias 304 of the first trace layer 302 and/or traces 308 of the second trace layer 306 are also in electrical communication with the pins 406 of the pin headers 322. The pins 406 of the pin headers 322 are received by the pin header openings 404. The top layer 414 of conductive material 320 on top of the vias 304 of the first trace layer 302 and the traces 308 of the second trace layer 306 are connected to the bottom layer 412 of conductive material 320 at the valleys 305 of the first trace layer 302 via the vias 304, resulting in the multilayer circuit board.

Figure 4K:
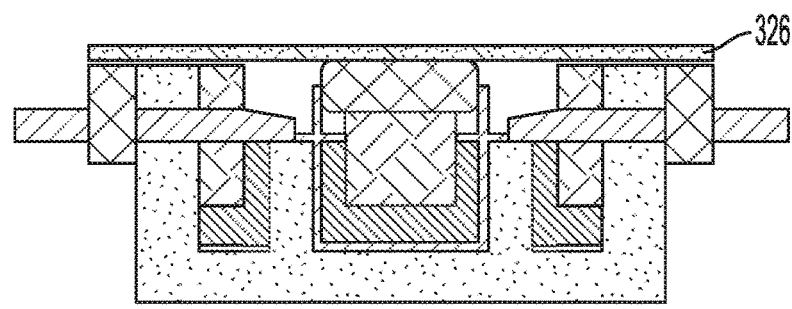

FIG. 4K illustrates a side cross-sectional view of the placement of a sealing sheet 326 on top of the circuit board 300. FIG. 4K corresponds to FIG. 3M.

Figure 4L:
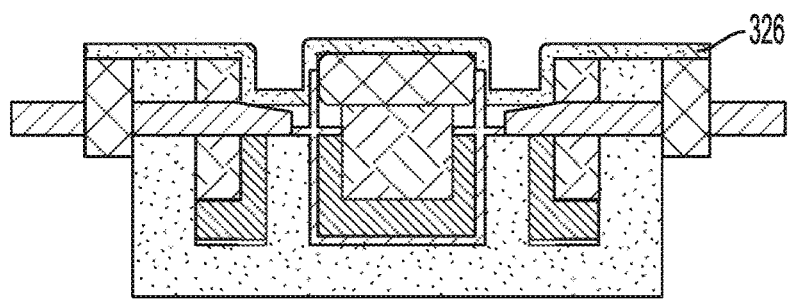

FIG. 4L illustrates a side cross-sectional view of the resulting circuit board 300 after the sealing sheet 326 is heated. When the sealing sheet 326 is heated, the sealing sheet 326 covers and molds to the features of the circuit board 300. FIG. 4L corresponds to FIG. 3N.

As shown in FIG. 3O, a lid 318 may be placed on top of the circuit board 300 and covering the circuit board 300. The lid 318 and the sealing sheet 326 protect the circuit board 300 and provide additional pressure and stability to maintain the connections in the circuit board 300.

FIGS. 3A-3O illustrate the second trace layer 306 having the conductive material 320 brushed onto its traces 308 and then placed on top of the first trace layer 302. FIGS. 4A-4L illustrate the second trace layer 306 placed on top of the first trace layer 302 and then having the conductive material 320 brushed onto its traces 308. Either order may be used with the systems and methods described herein.

While FIGS. 3A-3O and 4A-4L illustrate the electrical components 324 being located on top of the rail layer 314, the electrical components 324 may additionally be placed between the first trace layer 302 and the second trace layer 306, enabling a more compact and protective design.

In some embodiments, the channels that are designed for liquid metal traces can be hollow. These hollow channels can be used for microfluidics.

Applications of the multilayer circuit board include heat dissipation, reconfigurable antennas, lab on a chip, and embedded biomedical devices.

With more precise devices for additive manufacturing, such as more precise 3D printers, more detailed circuit boards can be produced. For example, with a 0.25 mm nozzle, electronic traces can only be as small as 0.25 mm, but with a 0.1 mm nozzle, the systems and methods described herein will be able to produce 0.1 mm traces. However, the systems and methods described herein are capable of more than just fabricating circuit boards as the scale becomes smaller. With a printer or other device that is capable of producing micron precision traces, MEMS (Microelectronicmechanical Systems) devices can be fabricated with the systems and methods described herein. In addition, with more tightly patched traces and wires produced by the system, electromagnets and transformers may also be produced.

If the printer filament is replaced with a flexible material such as polyurethane, flexible electronics can be produced. Similarly, a clear filament can produce transparent electronics. High temperature or high strength filaments will also change the characteristics of the electronic circuit. Optical fibers can be incorporated in the circuit through the hollow channels to create optoelectronics. Optical transmission and optoelectronic circuits can then be readily integrated.

The thinner each layer is, the easier and more likely it is to deform while being printed. Once the trace layers are snapped together, they must be as flat as possible without any defects such as curled up edges or corners. The conductive material will add some height between the layers. Multilayer circuit boards require a much higher tolerance than single layer circuit boards; therefore, the iteration process for multilayer circuit boards is longer FIGS. 5A-5C illustrate use of a pin stopper proximal to the pin header openings 204, 404 to provide a more robust contact between the circuit board 100, 300 and the pin headers 118, 322.

FIG. 5A illustrates a trace layer 502 and a rail layer 510 receiving a pin header 518. The trace layer 502 has a conductive material 516 disposed on top of a trace. When the circuit board is initially fabricated and connected to the pin header 518, the pin header 518 and the conductive material 516 are in electrical communication. However, as shown in FIG. 5A, a force or impact may be made at an exterior location 530 of the pin header 518. The force or impact may cause the pin header 518 to angle in a manner whereby the pin header 518 and the conductive material 516 are no longer in electrical communication.

FIG. 5B illustrates use of a pin stopper 550. The pin stopper 550 may be located adjacent to the pin header opening 504 and on the trace layer 502. The conductive material 516 may be disposed on the trace layer 502, including on top of the pin stopper 550. The pin header 518 may be inserted into the pin header opening 504, causing the pin header 518 to be in electrical communication with the conductive material 516 at the pin stopper 550. The pin stopper 550 ensures the pin header 518 is not inserted too far into the pin header opening 504.

FIG. 5C illustrates the pin stopper 550 maintaining electrical communication despite a force or impact made to the exterior location 530 of the pin header 518. The height of the pin stopper 550 allows the electrical communication between the pin header 518 and the conductive material 516 to be maintained despite the force or impact.

While the systems and methods described herein describe additively manufacturing the trace layer (e.g., trace layer 102) and the sacrificial layer (e.g., sacrificial layer 106) separately and placing the sacrificial layer on the trace layer before applying the conductive material to the traces of the trace layer, in some embodiments, the sacrificial layer and the trace layer may be additively manufactured together. The combined additive manufacture may obviate the steps of snapping components together and separating them, which may cause undesirable and non-negligible defects in smaller circuits.

FIGS. 6A-6D illustrate the combined additive manufacturing of the trace layer and the sacrificial layer.

Figure 6A:
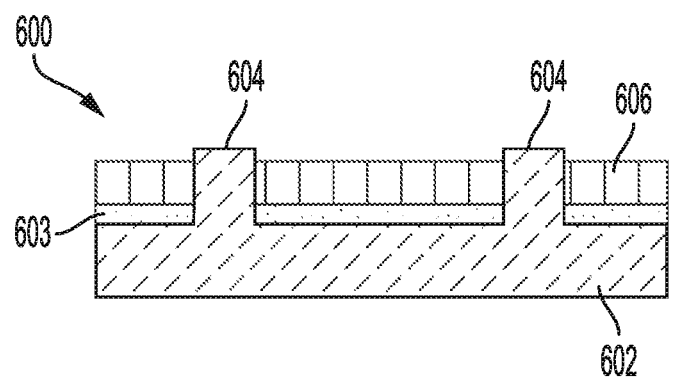
FIGS. 6A-6D illustrate manufacture of a combined trace layer and sacrificial layer, according to various embodiments of the invention.

FIG. 6A illustrates a side cross-sectional view of the combined trace-sacrificial layer 600.

The trace layer 602 is printed normally, but the sacrificial layer 606 is printed slightly above the trace layer 602. Because the sacrificial layer 606 is printed slightly above the trace layer 602 and not directly onto the trace layer 602, the extruded filament will cool slightly before touching the trace layer 602, creating a weaker and less permanent bond to the trace layer 602. In effect, a gap layer 603 that serves as a printed support structure is created that connects the trace layer 602 to the sacrificial layer 606. The gap layer 603 is weakly connected to both the sacrificial layer 606 and the trace layer 602. As shown in FIG. 6A, the traces 604 of the trace layer 602 still protrude from the sacrificial layer 606, and the gap layer 603 and the sacrificial layer 606 are printed around the traces 604.

In some embodiments, the trace layer 602, the gap layer 603, and the sacrificial layer 606 are made of the same material. In some embodiments, the trace layer 602 is made of a first material, and the gap layer 603 and the sacrificial layer 606 are made of a second material. In some embodiments, the trace layer 602 and the sacrificial layer 606 are made of a first material and the gap layer 603 is made of a second material. In some embodiments, each of the trace layer 602, the gap layer 603, and the sacrificial layer 606 are made of a different material.

Figure 6B:
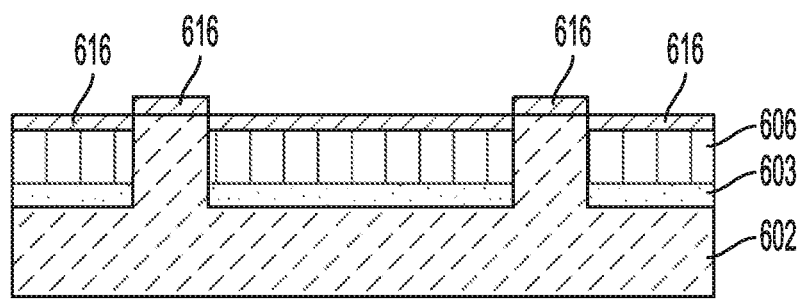
Figure 6C:
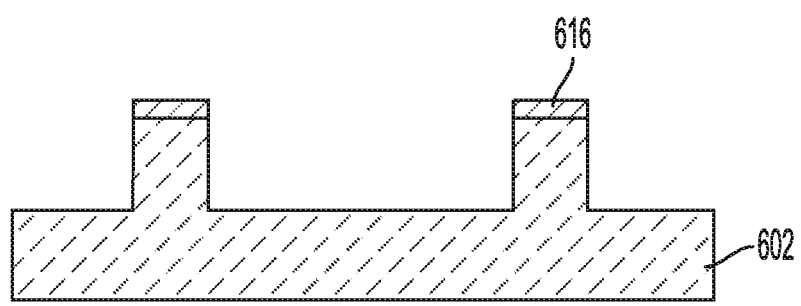

As shown in FIG. 6B, once the trace-sacrificial layer 600 is printed, a conductive material 616 (e.g., conductive material 116) can be applied to the trace-sacrificial layer 600. As shown in FIG. 6C, the sacrificial layer 606 is removed. The gap layer 603 may be brittle and separate from the trace layer 602 when the sacrificial layer 606 is removed. Any remaining remnants of the gap layer 603 may be wiped or blown away.

Not only does this integrated method produce a circuit with fewer defects, but also, the height of all layers can be significantly reduced. The sacrificial layer 606 no longer needs the extra thickness for structural integrity, as compared with the sacrificial layer 106; therefore, the sacrificial layer 606 and trace layer 602 can be much thinner. Although, the rail layer can be fabricated normally and snapped onto the trace layer at this step without concern, the rail layer can also be printed onto the trace layer by resuming the printing process. Unlike the sacrificial layer 606, the rail layer can be printed directly onto the surface of the trace layer 602, and this creates a stronger bond than the systems and methods described herein where the trace layer, the sacrificial layer, and the rail layer are fabricated separately.

Figure 6D:
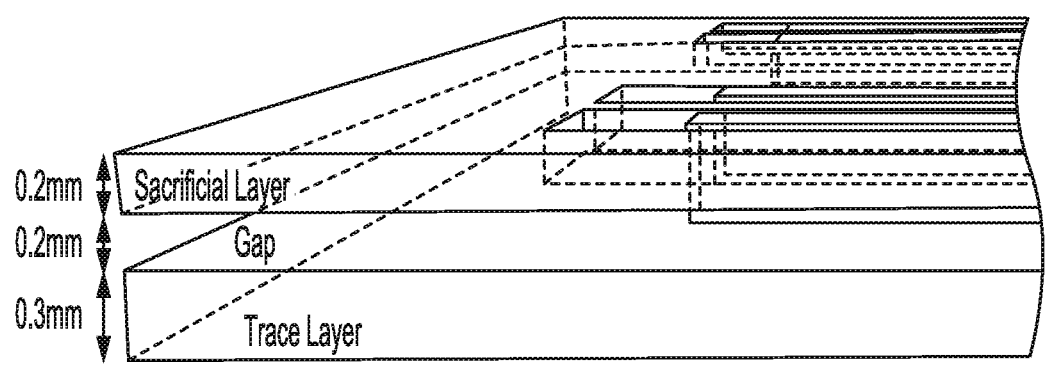

The thickness of each layer may be reduced using this integrated process. For example, with the integrated method of FIGS. 6A-6D, and using a 0.25 mm nozzle and a 0.1 mm height increment printer, the sacrificial layer thickness can be reduced to 0.2 mm from 0.7 mm, the trace layer thickness can be reduced to 0.7 mm from 1.8 mm, possibly 0.5 mm or 0.3 mm, and the second trace layer thickness can be reduced to 0.7 mm from 1.425 mm. With a more precise printer, these heights can be easily controlled and reduced. The image of the CAD design with dimensions is shown in FIG. 6D. If the liquid metal can be precisely deposited onto the elevated trace paths, the sacrificial layer can be eliminated, reducing the minimum height of the trace layer to 0.4 mm.

When designing and fabricating integrated circuit boards as described herein, it is important to consider that the larger the gap between the trace and sacrificial layer is, the weaker the bond between the trace and sacrificial layer will be, resulting in easier removal. However, a larger gap also means that the printer may have a more difficult time printing the sacrificial layer accurately. This issue can be somewhat countered by printing a thicker and more structurally sound sacrificial layer, but will also result in a thicker trace layer altogether. For the setup described herein, the minimum thickness of the gap is 0.2 mm and the maximum thickness is 0.4 mm. This allows the sacrificial layer to be removed without damaging the trace layer. Using a filament with different properties to print the sacrificial layer will allow for an even easier removal. For example, in an experiment, a sacrificial layer using acrylonitrile butadiene styrene (ABS) and polylactic acid (PLA) filament was tested on a PETG trace layer. The ABS sacrificial layer allowed removal of a 0.1 mm gap whereas the PLA sacrificial layer allowed removal with no gap at all between the trace and sacrificial layer.

Figure 7:
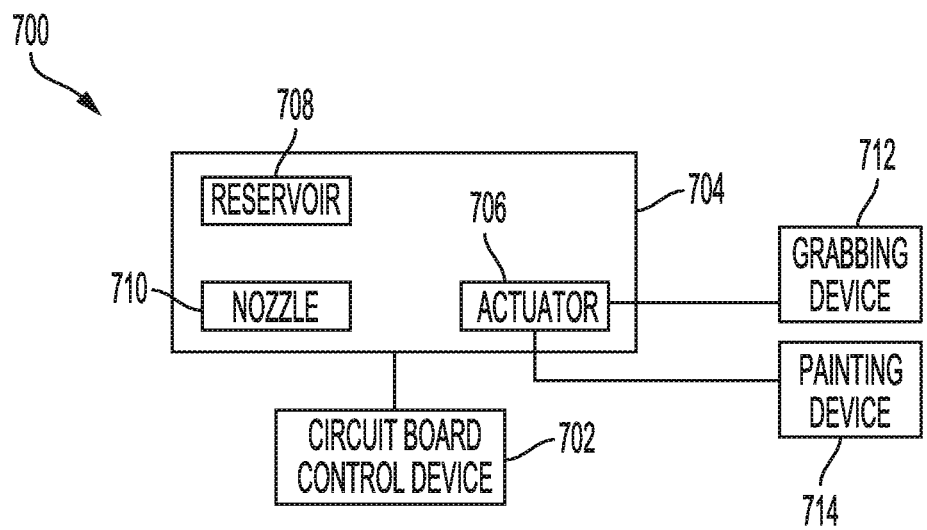
FIG. 7 illustrates a system for fabricating circuit boards, according to various embodiments of the invention.

FIG. 7 illustrates the circuit board manufacturing system according to various embodiments. The system 700 includes a circuit board control device 702 connected to an additive manufacturing device 704.

The circuit board control device 702 is configured to design circuit boards and communicate instructions to the additive manufacturing device 704 regarding how to manufacture the designed circuit boards. The circuit board control device 702 may include a processor, an input unit, a non-transitory memory, and a display. The processor may be one or more computer processing devices capable of performing instructions stored on the non-transitory memory. The input unit is configured to receive input from a user. For example, the input unit may be a keyboard, a mouse, a microphone, or a touchscreen. The non-transitory memory is configured to store data, such as circuit board design data. The display is configured to display the circuit board design.

The additive manufacturing device 704 includes an actuator 706, a reservoir 708, and a nozzle 710. The actuator 706 may be one or more actuators configured to adjust a location of the nozzle 710 relative to a platform or surface where the components of the circuit board (e.g., trace layer, sacrificial layer, rail layer, or lid) may be manufactured.

The actuator 706 may also control an amount (or flow) of material stored in the reservoir 708 that is emitted from the nozzle 710.

In some embodiments, the actuator 706 is also configured to cause a grabbing device 712 configured to grasp and move manufactured components, to move a first component on top of a second component. For example, the grabbing device 712 may grasp the sacrificial layer and place it on top of the trace layer, as described herein.

In some embodiments, the actuator 706 is also configured to cause a painting device 714 configured to apply or brush the conductive material to a surface, to brush the conductive material on top of manufactured components. For example, the painting device 714 may brush the conductive material on the sacrificial layer that is located on top of the trace layer.

Experiments using the systems and methods described herein with respect to single-layer circuit boards (e.g., FIGS. 1A-1L; FIGS. 2A-2L) were performed.

The commonly used instrumentation amplifier circuit was fabricated using the systems and methods described herein.

Figure 8:
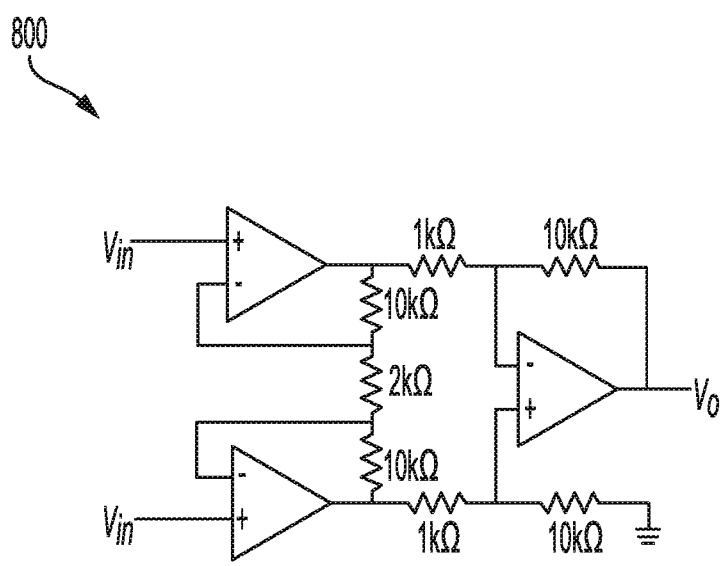
FIG. 8 illustrates a diagram of a circuit built in an experiment using the invention.

The circuit design is shown in FIG. 8. A JFET quad operational amplifier (TL084) was used in this case. All four parts were printed using a MakerGear™ M2 3D printer with a 0.25 mm nozzle and 1.75 mm polyethylene terephthalate glycol (PETG) at a 0.1 mm height increment. PETG was chosen because it is not conductive, inexpensive, and capable of being extruded to the level of detail needed to print the board pieces.

The traces stand at 1 mm tall and 0.5 mm wide. The sacrificial layer was snapped on top of the trace layer.

Liquid metal comprised of a 2:1 ratio of gallium (Ga) and tin (Sn) is heated to between 99° C. and 110° C. on a hotplate and painted on using a warm synthetic makeup brush. It is important to note that the Ga—Sn alloy should have a slush-like consistency at room temperature. The trace-sacrificial layer was uniformly coated and then the sacrificial layer was removed. The sacrificial layer was removed vertically such that the liquid metal traces remain intact and separated. This layer may be reused to produce more boards if it is not damaged during the removal step.

The rail layer was snapped into the trace layer. The rail layer is 0.7 mm taller than the sacrificial layer standing at 1.7 mm. Pin headers were inserted into the holders. The pin headers must be secure and resist movement if fiddled with. The components were placed using tweezers and slight pressure was applied to establish a strong contact with the liquid metal traces.

For additional downward force on the components and to ensure that the components are secured, a thin polycaprolactone (PCL) sheet is used to seal the components on the traces. A thin PCL sheet is created on a heated surface by melting PCL filaments on a non-stick material such as a teflon cloth on a hotplate at 110° C. A straightedge was used to spread the melted PCL until a uniform sheet about 0.1-0.2 mm thick was created. After the PCL sheet cooled, a piece slightly larger than the circuit board was cut. Excess around the borders is desired to coat the edges of the circuit board. The PCL sheet was placed on the board and heated to 140° C. with a heat gun until the PCL molded to the board. If desired, a lid piece that accounts for protruding components can be designed in a CAD software, printed, and molded onto the circuit with the PCL sheet and heat gun.

The resultant circuit board depends highly on the quality of the print job. If the trace or rail layer is deformed during the print process or while being taken off the print bed, the pieces were not used, as they would not snap into place as designed. These imperfections are consequences of the quality of printer used. The printing process of all layers (including the lid) takes 55 minutes with 50% infill and 3-layer outlines sliced in simplify 3D.

Printer settings were as follows:

Extruder: Nozzle Diameter: 0.25 mm; Extrusion Multiplier: 1.00; Extrusion Width: Manual: 0.25 mm; Retraction Distance: 1.00 mm; Extra Restart Distance: 0.00 mm; Retraction Vertical Lift: 0.00 mm; Retraction Speed: 1200.0 mm/min.

Layer: Primary Layer Height: 0.1000 mm; Top Solid Layers: 4; Bottom Solid Layers: 4; Outline/Perimeter Shells: 3; Outline Direction: Inside-Out.

Infill: Internal and External Fill Pattern: Rectilinear; Interior Fill Percentage: 50%; Outline Overlap: 25%; infill Extrusion Width: 100%; Minimum Infill Length: 5.00 mm.

Temperature: Extruder: 230 C; Temperature: 60 C.

Fan Speed: 100%.

Speeds: Default Printing Speed: 2800.0 mm/min; Outline Underspeed: 60%; Solid Infill Underspeed: 80%; X/Y Axis Movement Speed: 18000.0 mm/min; Z Axis Movement Speed: 1200.0 mm/min; Allow speed reduction down to: 20%.

Figure 9:
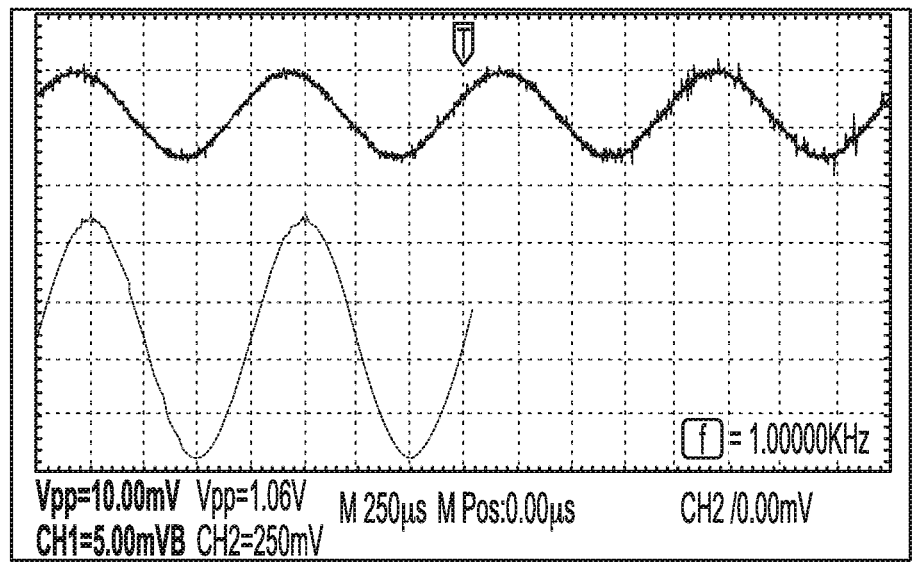
FIG. 9 illustrates testing results of the experiment using the invention.

Assembling the circuit as seen in FIGS. 1A-1L took an additional 10 minutes, bringing the total fabrication time to slightly over an hour. Once the final iteration of the design was determined, six instrumentation amplifiers were assembled using the systems and methods described herein. All six circuit boards were tested and yielded the expected output as seen in FIG. 9. This indicates reliability in the method. An input voltage of 10 mV with no offset voltage at 1 kHz yielded an output voltage of 1.06 V with an experimental gain of 106 compared to the theoretical gain of 110V/V.

Resistivity tests were performed for various trace widths. Table I contains the results. When the liquid metal is brushed on, the height of the liquid metal is not uniform and has a certain thickness to it. The thickness is an advantage to the circuit board fabrication as it increases the cross-sectional area of the metal trace. Metal contacts from the surface mount elements form better contacts as they sink into the Ga—Sn alloy. To ensure that the thickness of the traces is as uniform as possible for resistivity testing, the traces were scraped with a straight edge, reducing the thickness of the traces significantly. Thus, the experimental values in Table I are the worst-case scenarios.

TABLE I

Resistance of the Liquid Metal Traces at 23 Degrees Celsius

| Trace Width (mm) | Resistance per 10 mm ($\Omega$/mm) |
|---|---|
| 0.25 | 0.208 |
| 0.50 | 0.197 |
| 0.60 | 0.178 |
| 0.70 | 0.166 |
| 0.80 | 0.164 |
| 0.90 | 0.152 |
| 1.00 | 0.145 |

It was not possible to print widths between 0.25 mm and 0.50 mm because the nozzle size is 0.25 mm. For example, to print a width of 0.3 mm, the printer produces a single trace of 0.25 mm, and then it must extrude a trace that is 0.05 mm, which was not possible due to the nozzle diameter. It was possible for the printer to perform zig zag motions to create a 0.3 mm trace; however, the MakerGear™ printer did not produce consistent trace widths without first printing the borders of straight traces. The inconsistency leads to uneven heights and deformations.

Experiments using the systems and methods described herein with respect to multilayer circuit boards (e.g., FIGS. 3A-3O; FIGS. 4A-4L) were also performed.

Figure 10:
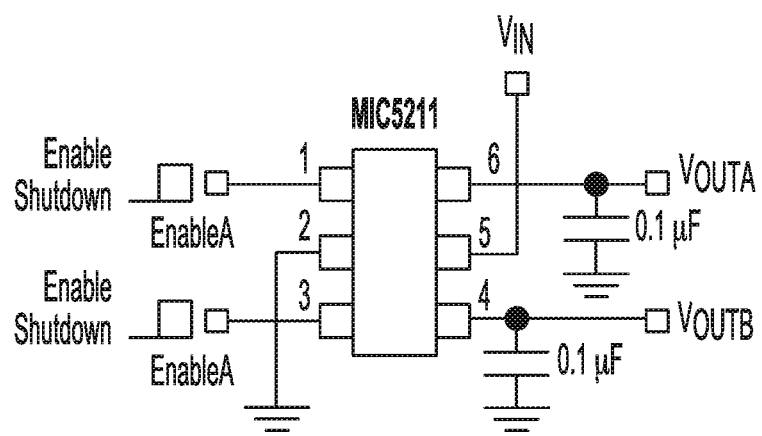
FIG. 10 illustrates a diagram of a second circuit built in an experiment using the invention.

As a proof of concept for multilayer, a dual port voltage regulator circuit as seen in FIG. 10 was fabricated using the systems and methods described herein. A low-dropout regulator chip (MIC5211 LFLX) was used in this example. A multilayer design was implemented using a ground plane to connect the three grounds together.

All parts were designed on the computer aided design (CAD) program, SketchUp™ and fabricated using a MakerGear™ M2 3D printer with a 0.25 mm nozzle and 1.75 mm polyethylene terephthalate glycol (PETG) at 0.1 mm height increment. Other printer filaments and nozzle head sizes may be used to achieve different degrees of details and rigidity.

The process illustrated in FIGS. 3A-3O were performed. The liquid metal was made by melting a ratio of 2:1 Ga—Sn at 232° C. Once alloyed, it was applied to the trace layer at 110° C. The alloy is a liquid when brushed onto the traces. At room temperature, the alloy has a slush-like consistency, meaning the alloy is in a more solid state. Oxidation causes the outer shell to be more solid, but the inside is like an extremely viscous liquid resembling wet sand.

The circuit was tested with an input of 12V DC, and the EnableA and EnableB pins were connected to the 12V supply. Pins 2, 4, and 6 were connected through the ground plane, and the expected 3.3V and 5V outputs were achieved.

The sealing sheet was made by melting PCL pellets on Teflon at 110° C. A straight edge was used to form a thin sheet about 0.1 to 0.2 mm thick. The PCL sealing sheet was heated with a heat gun at 140° C. until the PCL molded to the circuit board. The lid was quickly adhered to the board while the PCL is still warm and malleable.

The MakerGear™ M2 printer used did not maintain consistency with each print job. The vias were often slightly contorted instead of standing perfectly straight, and the via holes tended to be irregular in shape. Additionally, the heights of the traces were not continuously uniform. The ends of the traces were taller because when the nozzle moved away, a small amount of the filament would be pulled out of the nozzle due to surface tension. The print speed was reduced to increase the accuracy of the print job at the expense of an increased print time. Furthermore, the legs and spacing of the MIC5211 chip are much smaller (2.8 mm×2.9 mm×1.0 mm) than the amplifier chip shown in FIG. 8 that was previously fabricated in a previous experiment. This design pushed the printer to its limits by printing 0.25 mm traces. With the thinner traces, the inconsistency of the printer was further exacerbated. These factors resulted in a success rate of 90% after the final iteration of the design. The dimensions of the board, not including the pin headers, were 17.7 mm×9.6 mm×4.4 mm.

Common contact metals such as anodic coloring 6063 aluminum-alloy and 1Cr18Ni9 stainless steel showed no reaction with gallium. The reaction between the Ga—Sn alloy and a gold-plated nickel strip (40 mm×1.3 mm×0.2 mm) was tested. The gallium and tin alloyed with the gold immediately. The initial end to end resistance of the metal strip was 0.138$\Omega$ and increased to 0.145$\Omega$ after corrosion. The alloying did not diminish the conductivity of the metal significantly because the metal underneath the gold plating does not react with the Ga—Sn alloy. An alloy of different metals for the liquid metal traces such as bismuth, indium and/or, tin would also combat the alloying issue.

The MIC5211 chip used in this example has an operating temperature range of −40° C. to 125° C. whereas the melting point (MP) of PETG and PCL is 210° C. and 60° C. respectively. Using a filament with a higher MP or incorporating heat sinks would eliminate this issue. Plastics such as polycarbonate (PC) and polyetherimide (PEI) have a glass transition point (GTP) above 148° C. and 215° C. respectively. Both PC and PEI are available in filament form. For even higher GTP thermoplastics, it is possible to use polyetherketones (PEEKs) which continue to maintain mechanical properties at 248° C.

The systems and methods described herein have the potential to become an alternative for PCB production. As Electronic Design Automation (EDA) software is developed for the systems and methods described herein, the process will become more efficient. The boards can be fabricated with a $2,000 3D printer instead of an expensive milling machine that can cost tens of thousands of dollars. The MakerGear™ M2 3D printer was purchased for $1,800 in 2014. One pound of white 1.75 mm PETG filament was purchased for $38.00 from MatterHackers, and 32 ounces of PCL pellets were bought from IC3D for $29.99 in 2018. Operation of a 3D printer is much easier than a milling machine, making PCB fabrication a more accessible process. Soldering is a procedure that can be completely eliminated since all the circuit elements are placed on the traces and secured with plastic. PCBs fabricated with the systems and methods described herein can also be completely recycled, which is a challenge for traditional PCBs. The board is made of a recyclable thermoplastic. The Ga—Sn alloy can be removed as Galinstan (Ga—In—Sn) would with sodium hydroxide. This was tested on the circuit described herein. The plastic can be melted down and repurposed. Although both gallium and tin are more expensive than copper, because the traces are produced with additive manufacturing and not subtractive manufacturing, the actual amount of gallium and tin required and wasted is minimal. The instrumentation amplifier circuit board fabricated used 0.1039 g of the Ga—Sn alloy, which translates to approximately $0.0242. Additionally, the PETG, PCL, and metals are non-toxic. This broadens the range that these circuit boards can be used. For example, they can be used in water that humans and animals consume. There is a much lower risk of contaminating the environment compared to traditional PCBs. The assembly of a circuit board as described herein emphasizes simplicity and accessibility. No special technique is required to create functioning circuit traces. While there have been numerous successes with screen printing techniques, simply brushing the liquid metal onto the trace-sacrificial layers completely coated the traces. Using a mesh screen may lead to discontinuities in the liquid metal as it is more solid than other liquid conductive inks. Spray brushing the liquid metal on via an aerosol is another cheap method to deposit the Ga—Sn alloy onto the substrate. However, the brushing method leaves a thick coat on the traces, so the electrical components can sink in without the use of any epoxies.

The Ga—Sn alloy was a more favorable conductive material to use because it becomes more solid as it cools off. When the surface mounted elements are placed on the warm liquid metal, the liquid metal conforms around the element and cools off in that shape. It is also less expensive than inks on the market such as silver, gold, and carbon nanotube inks. The significance of the systems and methods described herein is not just in its ability to create functioning circuit traces, but the fact that recyclable, robust, fully packaged circuitry can be achieved quickly and inexpensively.

Figure 11:
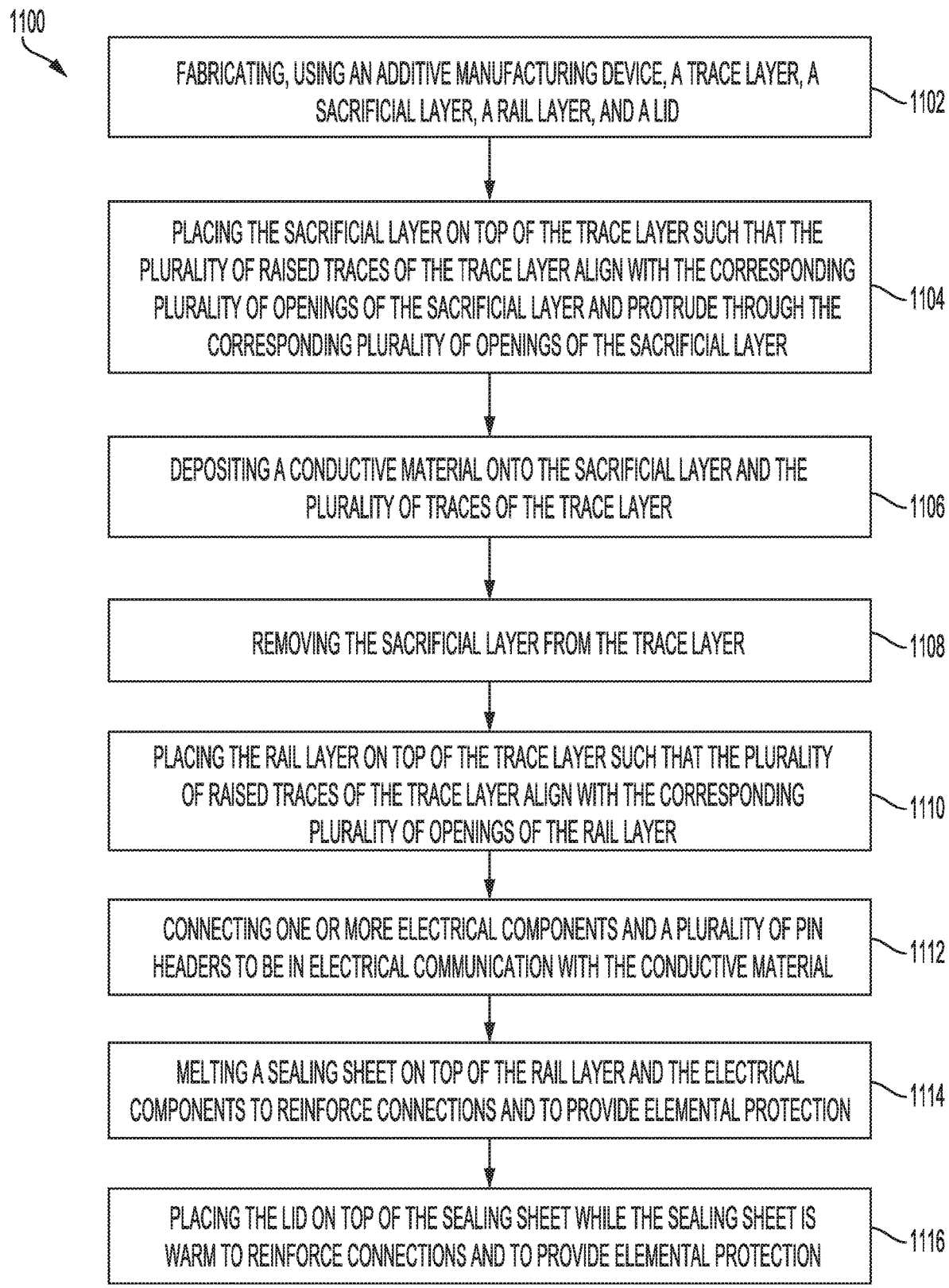
FIG. 11 illustrates an example process of fabricating a circuit board, according to various embodiments of the invention.

FIG. 11 illustrates a process 1100 of fabricating a circuit board (e.g., circuit board 100).

A circuit board control device (e.g., circuit board control device 702) creates a design for the circuit board. The circuit board control device communicates instructions to an additive manufacturing device (e.g., additive manufacturing device 704) to fabricate components of the circuit board. The additive manufacturing device fabricates a trace layer (e.g., trace layer 102), a sacrificial layer (e.g., sacrificial layer 106), a rail layer (e.g., rail layer 110), and a lid (e.g., lid 114) (step 1102).

The additive manufacturing device fabricates the trace layer to include a plurality of raised traces (e.g., traces 104). The additive manufacturing device fabricates the sacrificial layer to include a plurality of openings (e.g., openings 108) corresponding to the raised traces of the trace layer. The additive manufacturing device fabricates the rail layer to include a plurality of openings (e.g., openings 112) corresponding to the raised traces of the trace layer. The additive manufacturing device fabricates the lid to include a plurality of recesses (e.g., recesses 115) configured to receive electrical components and/or protrusions (e.g., protrusions 117) configured to contact electrical components.

The sacrificial layer is placed on top of the trace layer such that the plurality of raised traces of the trace layer align with the corresponding plurality of openings of the sacrificial layer and protrude through the corresponding plurality of openings of the sacrificial layer (step 1104). In some embodiments, this is done by hand. In some embodiments, a machine (e.g., grabbing device 712) automatically performs this step according to instructions received from the circuit board control device.

A conductive material (e.g., conductive material 116) is deposited onto the sacrificial layer and the plurality of traces of the trace layer (step 1106). In some embodiments, this is done by hand. In some embodiments, a machine (e.g., painting device 714) automatically performs this step according to instructions received from the circuit board control device.

The sacrificial layer is removed from the trace layer (step 1108). In some embodiments, this is done by hand. In some embodiments, a machine (e.g., grabbing device 712) automatically performs this step according to instructions received from the circuit board control device.

The rail layer is placed on top of the trace layer such that the plurality of raised traces of the trace layer align with the corresponding plurality of openings of the rail layer (step 1110). In some embodiments, this is done by hand. In some embodiments, a machine (e.g., grabbing device 712) automatically performs this step according to instructions received from the circuit board control device.

One or more electrical components (e.g., electrical components 120) and a plurality of pin headers (e.g., pin headers 118) to be in electrical communication with the conductive material are connected (step 1112). In some embodiments, this is done by hand. In some embodiments, a machine (e.g., grabbing device 712) automatically performs this step according to instructions received from the circuit board control device.

A sealing sheet is placed on top of the rail layer and the electrical components and melted in order to reinforce connections and to provide elemental protection (step 1114). In some embodiments, this is done by hand. In some embodiments, a machine (e.g., grabbing device 712) automatically performs this step according to instructions received from the circuit board control device.

The lid is placed on top of the sealing sheet while the sealing sheet is warm to reinforce connections and to provide elemental protection (step 1116). In some embodiments, this is done by hand. In some embodiments, a machine (e.g., grabbing device 712) automatically performs this step according to instructions received from the circuit board control device.

Figure 12B:
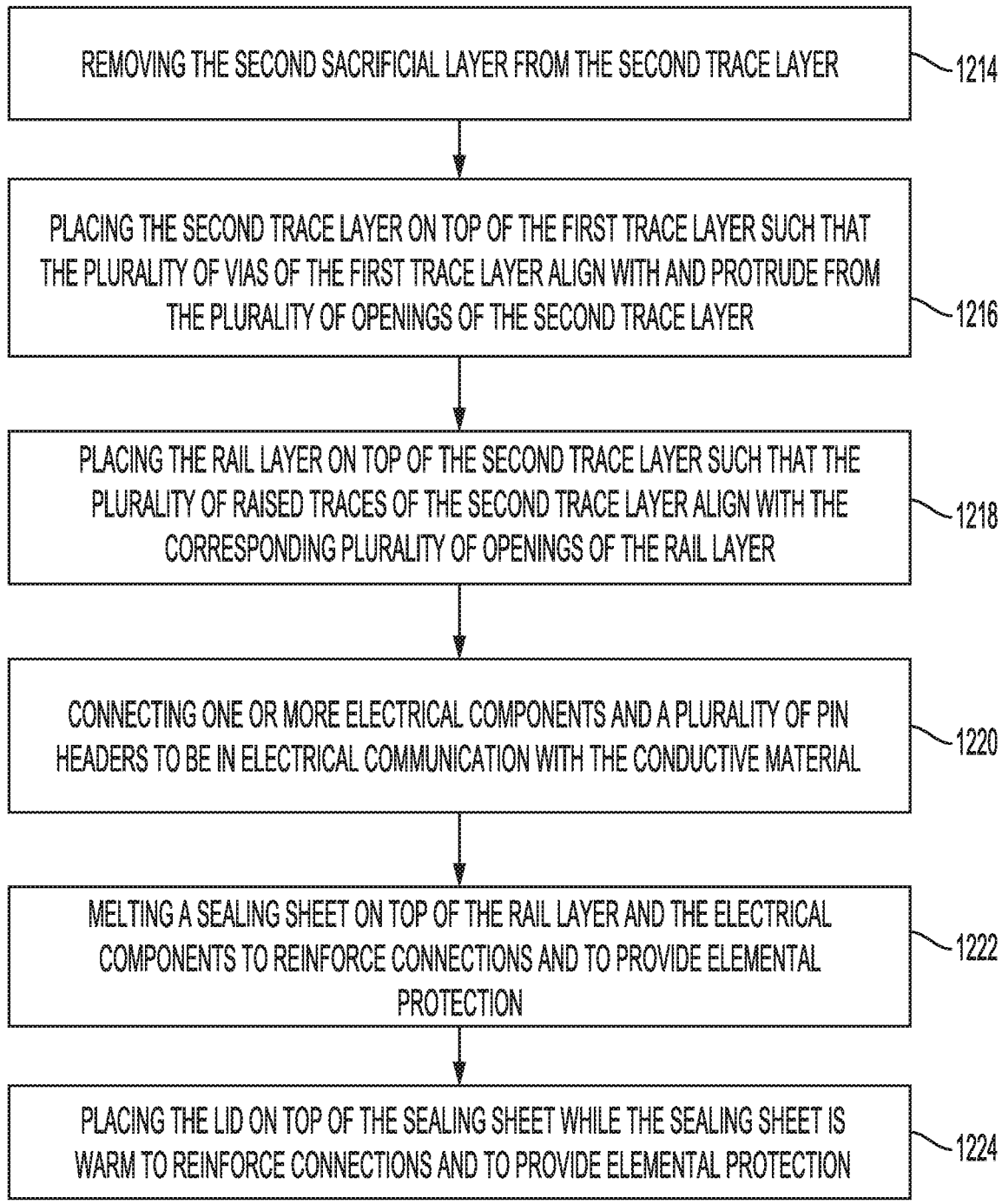

FIGS. 12A-12B illustrate a process 1200 of fabricating a multilayer circuit board (e.g., circuit board 300).

A circuit board control device (e.g., circuit board control device 702) creates a design for the multilayer circuit board. The circuit board control device communicates instructions to an additive manufacturing device (e.g., additive manufacturing device 704) to fabricate components of the multilayer circuit board. The additive manufacturing device fabricates a first trace layer (e.g., first trace layer 302), a second trace layer (e.g., second trace layer 306), a first sacrificial layer (e.g., sacrificial layer 410), a second sacrificial layer (e.g., sacrificial layer 310), a rail layer (e.g., rail layer 314), and a lid (e.g., lid 318) (step 1202).

The first sacrificial layer is placed on top of the first trace layer such that the plurality of vias (e.g., vias 304) of the first trace layer align with the corresponding plurality of openings of the first sacrificial layer and protrude through the corresponding plurality of openings of the first sacrificial layer (step 1204). In some embodiments, this is done by hand. In some embodiments, a machine (e.g., grabbing device 712) automatically performs this step according to instructions received from the circuit board control device.

A conductive material (e.g., conductive material 320) is deposited onto the first sacrificial layer and onto the plurality of vias of the first trace layer (step 1206). In some embodiments, this is done by hand. In some embodiments, a machine (e.g., painting device 714) automatically performs this step according to instructions received from the circuit board control device.

The first sacrificial layer is removed from the first trace layer (step 1208). In some embodiments, this is done by hand. In some embodiments, a machine (e.g., grabbing device 712) automatically performs this step according to instructions received from the circuit board control device.

The second sacrificial layer is placed on top of the second trace layer such that the plurality of raised traces (e.g., traces 308) of the second trace layer align with the corresponding plurality of openings (e.g., openings 312) of the second sacrificial layer and protrude through the corresponding plurality of openings of the second sacrificial layer (step 1210). In some embodiments, this is done by hand. In some embodiments, a machine (e.g., grabbing device 712) automatically performs this step according to instructions received from the circuit board control device.

The conductive material is deposited onto the second sacrificial layer and onto the plurality of traces of the second trace layer (step 1212). In some embodiments, this is done by hand. In some embodiments, a machine (e.g., painting device 714) automatically performs this step according to instructions received from the circuit board control device.

The second sacrificial layer is removed from the second trace layer (step 1214). In some embodiments, this is done by hand. In some embodiments, a machine (e.g., grabbing device 712) automatically performs this step according to instructions received from the circuit board control device.

The second trace layer is placed on top of the first trace layer such that the plurality of vias of the first trace layer align with and protrude from the plurality of openings (e.g., openings 307) of the second trace layer (step 1216). In some embodiments, this is done by hand. In some embodiments, a machine (e.g., grabbing device 712) automatically performs this step according to instructions received from the circuit board control device.

The rail layer is placed on top of the second trace layer such that the plurality of raised traces of the second trace layer align with the corresponding plurality of openings (e.g., openings 316) of the rail layer (step 1218). In some embodiments, this is done by hand. In some embodiments, a machine (e.g., grabbing device 712) automatically performs this step according to instructions received from the circuit board control device.

One or more electrical components (e.g., electrical components 324) and a plurality of pin headers (e.g., pin headers 322) to be in electrical communication with the conductive material are connected (step 1220). In some embodiments, this is done by hand. In some embodiments, a machine (e.g., grabbing device 712) automatically performs this step according to instructions received from the circuit board control device.

A sealing sheet is placed on top of the rail layer and the electrical components and melted in order to reinforce connections and to provide elemental protection (step 1222). In some embodiments, this is done by hand. In some embodiments, a machine (e.g., grabbing device 712) automatically performs this step according to instructions received from the circuit board control device.

The lid is placed on top of the sealing sheet while the sealing sheet is warm to reinforce connections and to provide elemental protection (step 1224). In some embodiments, this is done by hand. In some embodiments, a machine (e.g., grabbing device 712) automatically performs this step according to instructions received from the circuit board control device.

Exemplary embodiments of the methods/systems have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. A method for fabricating a circuit board, the method comprising:
   fabricating, using an additive manufacturing device, a trace layer, a sacrificial layer, and a rail layer, the trace layer having a plurality of raised traces, the sacrificial layer having a plurality of openings corresponding to the plurality of raised traces of the trace layer, and the rail layer having a plurality of openings corresponding to the plurality of raised traces of the trace layer and one or more recesses for receiving electrical components;
   placing the sacrificial layer on top of the trace layer such that the plurality of raised traces of the trace layer align with the corresponding plurality of openings of the sacrificial layer and protrude through the corresponding plurality of openings of the sacrificial layer;
   depositing a conductive material on top of the sacrificial layer and the plurality of traces of the trace layer;
   removing the sacrificial layer from the trace layer;
   placing the rail layer on top of the trace layer such that the plurality of raised traces of the trace layer align with the corresponding plurality of openings of the rail layer;
   connecting one or more electrical components to be in electrical communication with the conductive material by placing the electrical components in the respective one or more recesses of the rail layer; and
   melting a sealing sheet on top of the rail layer and the electrical components to reinforce connections between the electrical components and the conductive material and to provide elemental protection.

2. The method of claim 1, wherein the trace layer and the rail layer each have aligning header openings configured to receive a pin header, and
   wherein the method further comprises connecting a plurality of pin headers to the conductive material covering the plurality of raised traces via the header openings.

3. The method of claim 2, wherein fabricating the trace layer includes fabricating one or more pin stoppers located proximal to respective header openings, the one or more pin stoppers configured to be covered by the conductive material and maintain connection with the respective pin header when a force is exerted against the pin header causing the pin header to move within the header opening.

4. The method of claim 1, further comprising:
fabricating, using an additive manufacturing device, a lid; and
placing the lid on top of the sealing sheet while the sealing sheet is warm, the lid configured to reinforce connections between the electrical components and the conductive material and to provide elemental protection.

5. The method of claim 1, wherein the additive manufacturing device is a 3D printer.

6. The method of claim 1, wherein the additive manufacturing device uses a non-toxic material to fabricate the trace layer, the sacrificial layer, and the rail layer.

7. The method of claim 1, further comprising removing the conductive material from the sacrificial layer, and melting the sacrificial layer to reuse a material the sacrificial layer is made of.

8. The method of claim 1, further comprising melting a second sealing sheet below the trace layer to provide further elemental protection.

9. A method for fabricating a multilayer circuit board, the method comprising:
fabricating, using an additive manufacturing device, a first trace layer, a second trace layer, a sacrificial layer, and a rail layer, the first trace layer having a plurality of vias, the second trace layer having a plurality of raised traces and a plurality of openings corresponding to the plurality of vias, the sacrificial layer having a plurality of openings corresponding to the plurality of raised traces of the second trace layer, and the rail layer having a plurality of openings corresponding to the plurality of raised traces of the second trace layer and one or more recesses for receiving electrical components;
depositing a conductive material onto at least a portion of the first trace layer, including the plurality of vias;
placing the sacrificial layer on top of the second trace layer such that the plurality of raised traces of the second trace layer align with the corresponding plurality of openings of the sacrificial layer and protrude through the corresponding plurality of openings of the sacrificial layer;
depositing the conductive material onto the sacrificial layer and the plurality of traces of the second trace layer;
removing the sacrificial layer from the second trace layer;
placing the second trace layer on top of the first trace layer such that the plurality of vias of the first trace layer align with and protrude from the corresponding plurality of openings of the second trace layer;
placing the rail layer on top of the second trace layer such that the plurality of raised traces of the second trace layer align with the corresponding plurality of openings of the rail layer;
connecting one or more electrical components to be in electrical communication with the conductive material by placing the electrical components in the respective one or more recesses of the rail layer; and
melting a sealing sheet on top of the rail layer and the electrical components to reinforce connections between the electrical components and the conductive material and to provide elemental protection.

10. The method of claim 9, wherein the first trace layer and the rail layer each have aligning header openings configured to receive a pin header, and wherein the method further comprises inserting a plurality of pin headers to respective header openings to connect the pin headers to the conductive material covering the plurality of raised traces and the plurality of vias.

11. The method of claim 9, wherein the second trace layer is placed on top of the first trace layer prior to placing the sacrificial layer on top of the second trace layer and depositing the conductive material onto the sacrificial layer and the plurality of traces of the second trace layer.

12. The method of claim 9, wherein the second trace layer is placed on top of the first trace layer after the sacrificial layer is placed on top of the second trace layer and the conductive material is deposited onto the sacrificial layer and the plurality of traces of the second trace layer.

13. The method of claim 9, further comprising:
fabricating, using an additive manufacturing device, a lid; and
placing the lid on top of the sealing sheet while the sealing sheet is warm, the lid configured to reinforce connections between the electrical components and the conductive material and to provide elemental protection.

14. The method of claim 9, wherein the additive manufacturing device is a 3D printer.

15. The method of claim 9, wherein the additive manufacturing device uses a non-toxic material to fabricate the trace layer, the sacrificial layer, and the rail layer.

16. The method of claim 9, further comprising removing the conductive material from the sacrificial layer, and melting the sacrificial layer to reuse a material the sacrificial layer is made of.

17. The method of claim 9, further comprising melting a second sealing sheet below the trace layer to provide further elemental protection.

18. A method for fabricating a circuit board, the method comprising:
fabricating, using an additive manufacturing device, a trace layer, a gap layer onto the trace layer, and a sacrificial layer onto the gap layer, the gap layer being printed above the trace layer and not directly onto the trace layer such that extruded filament from the additive manufacturing device cools before touching the trace layer and creating a non-permanent bond to the trace layer;
fabricating, using the additive manufacturing device, a rail layer;
depositing a conductive material on top of the sacrificial layer and a plurality of traces of the trace layer;
breaking the non-permanent bond established by the gap layer to remove the sacrificial layer from the trace layer; and
placing the rail layer on top of the trace layer such that the plurality of raised traces of the trace layer align with a corresponding plurality of openings of the rail layer.

19. The method of claim 18, further comprising:
connecting one or more electrical components to be in electrical communication with the conductive material by placing the electrical components in respective one or more recesses of the rail layer;
melting a sealing sheet on top of the rail layer and the electrical components to reinforce connections between the electrical components and the conductive material and to provide elemental protection.

20. The method of claim 19, wherein the trace layer and the rail layer each have aligning header openings configured to receive a pin header, and wherein the method further comprises:

connecting a plurality of pin headers to the conductive material covering the plurality of raised traces via the header openings;

fabricating, using an additive manufacturing device, a lid; and placing the lid on top of the sealing sheet while the sealing sheet is warm, the lid configured to reinforce connections between the electrical components and the conductive material and to provide elemental protection.

* * * * *